United States Patent
Kim et al.

(10) Patent No.: US 12,421,598 B2
(45) Date of Patent: Sep. 23, 2025

(54) NANOCRYSTALLINE GRAPHENE AND METHOD OF FORMING NANOCRYSTALLINE GRAPHENE

(71) Applicant: Samsung Electronics Co., Ltd., Suwon-si (KR)

(72) Inventors: Sangwon Kim, Seoul (KR);
Kyung-Eun Byun, Seongnam-si (KR);
Yeonchoo Cho, Seongnam-si (KR);
Keunwook Shin, Yongin-si (KR);
Eunkyu Lee, Yongin-si (KR);
Changseok Lee, Gwacheon-si (KR);
Hyunjae Song, Hwaseong-si (KR);
Hyeonjin Shin, Suwon-si (KR);
Jungsoo Yoon, Hwaseong-si (KR);
Soyoung Lee, Yongin-si (KR);
Hyunseok Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 381 days.

(21) Appl. No.: 17/711,147

(22) Filed: Apr. 1, 2022

(65) Prior Publication Data
US 2022/0316052 A1    Oct. 6, 2022

(30) Foreign Application Priority Data

Apr. 1, 2021 (KR) .................. 10-2021-0042820

(51) Int. Cl.
*C23C 16/26* (2006.01)
*C01B 32/186* (2017.01)
(Continued)

(52) U.S. Cl.
CPC ............ *C23C 16/26* (2013.01); *C01B 32/186* (2017.08); *C23C 16/02* (2013.01); *C23C 16/505* (2013.01);
(Continued)

(58) Field of Classification Search
CPC .................................. C01B 32/186–32/188
See application file for complete search history.

(56) References Cited

U.S. PATENT DOCUMENTS 10,151,027 B2 * 12/2018 Chugh .............. H01L 21/02395
2013/0174968 A1    7/2013 Vlassiouk et al.
(Continued)

FOREIGN PATENT DOCUMENTS

CN         105274500 A    1/2016
CN         109824042 A    5/2019
(Continued)

OTHER PUBLICATIONS

Machine translation of KR 20150083776. Retrieved Jul. 13, 2024.*
(Continued)

*Primary Examiner* — Prashant J Khatri
(74) *Attorney, Agent, or Firm* — HARNESS, DICKEY & PIERCE, P.L.C.

(57) ABSTRACT

Provided are nanocrystalline graphene and a method of forming the same. The nanocrystalline graphene may include a plurality of grains formed by stacking a plurality of graphene sheets and has a grain density of about 500 ea/$\mu m^2$ or higher and a root-mean-square (RMS) roughness in a range of about 0.1 or more to about 1.0 or less. When the nanocrystalline graphene has a grain density and a RMS roughness with these ranges, nanocrystalline graphene capable of covering the entirety of a large area on a substrate as a thin layer may be provided.

25 Claims, 20 Drawing Sheets

(51) Int. Cl.
  *C23C 16/02*     (2006.01)
  *C23C 16/505*    (2006.01)
  *C23C 16/511*    (2006.01)
  *H01L 21/285*    (2006.01)
  *H10D 62/83*     (2025.01)
  *H10D 64/62*     (2025.01)

(52) U.S. Cl.
  CPC ...... *C23C 16/511* (2013.01); *H01L 21/28556* (2013.01); *H10D 62/83* (2025.01); *H10D 64/62* (2025.01)

(56) References Cited

U.S. PATENT DOCUMENTS

| | | | |
|---|---|---|---|
| 2015/0098891 A1 | 4/2015 | Song et al. | |
| 2016/0240482 A1 | 8/2016 | Song et al. | |
| 2017/0253962 A1* | 9/2017 | Chugh | C01B 32/182 |
| 2019/0161351 A1 | 5/2019 | Song et al. | |
| 2020/0039827 A1 | 2/2020 | Jung et al. | |

FOREIGN PATENT DOCUMENTS

| | | | |
|---|---|---|---|
| CN | 108396377 B | | 5/2020 |
| KR | 20150083776 A | * | 7/2015 |
| KR | 2019/0063369 A | | 6/2019 |

OTHER PUBLICATIONS

Chugh et al. "Comparison of graphene growth on arbitrary non-catalytic substrates using low-temperature PECVD", Carbon, 93, (2015); pp. 393-399.*

Guo et al. "Direct formation of wafer-scale single-layer graphene films on the rough surface substrate by PECVD", Carbon, 129, (2018); pp. 456-461.*

Extended Search Report dated Sep. 8, 2022 issued in related European patent application No. 22160707.0.

Donghua Liu, et al, 'Two-step growth of graphene with separate controlling nucleation and edge growth directly on SiO$_2$substrates', *CARBON*, vol. 72, Jun. 1, 2014, pp. 387-392.

R. Chau, "Process and Packaging Innovations for Moore's Law Continuation and Beyond," 2019 IEEE International Electron Devices Meeting (IEDM), San Francisco, CA, USA, 2019, pp. 1.1.1-1.1.6, doi: 10.1109/IEDM19573.2019.8993462.

Lee, C.-S et al."Fabrication of Metal/Graphene Hybrid Interconnects by Direct Graphene Growth and Their Integration Properties" Adv. Electron. Mater. 2018, 4, 1700624. https://doi.org/10.1002/aelm.201700624.

Lee, M.-H. et al."Two-Dimensional Materials Inserted at the Metal/Semiconductor Interface: Attractive Candidates for Semiconductor Device Contacts" Nano Letters 2018 18 (8), 4878-4884. DOI: 10.1021/acs.nanolett.8b01509.

Sang Won Kim et al., "Graphene-Based Etch Resist for Semiconductor Device Fabrication", ACS Applied Nano Materials 2020 3 (5), 4635-4641. DOI: 10.1021/acsanm.0c00658.

* cited by examiner

NANOCRYSTALLINE GRAPHENE AND METHOD OF FORMING NANOCRYSTALLINE GRAPHENE

CROSS-REFERENCE TO RELATED APPLICATION

This application is based on and claims priority under 35 U.S.C. § 119 to Korean Patent Application No. 10-2021-0042820, filed on Apr. 1, 2021, in the Korean Intellectual Property Office, the disclosure of which is incorporated by reference herein in its entirety.

BACKGROUND

1. Field

The present disclosure relates to nanocrystalline graphene and/or a method of forming the nanocrystalline graphene, and more particularly, to nanocrystalline graphene and/or a method in which nanocrystalline graphene is grown directly on a substrate by a plasma chemical vapor deposition process.

2. Description of the Related Art

Graphene is a crystalline material having a hexagonal honeycomb structure in which carbon atoms are two-dimensionally connected to each other. Graphene is very thin, and the thickness of a graphene layer may be equal to that of a mono-atomic layer. Graphene may be synthesized via chemical vapor deposition (CVD) or may be obtained by peeling graphite layer by layer.

SUMMARY

Provided is nanocrystalline graphene according to an embodiment and/or a method of forming the nanocrystalline graphene by directly growing nanocrystalline graphene on a substrate using a plasma chemical vapor deposition process.

Additional aspects will be set forth in part in the description which follows and, in part, will be apparent from the description, or may be learned by practice of the presented embodiments of the disclosure.

According to an embodiment, a nanocrystalline graphene includes a plurality of grains in a stack of a plurality of graphene sheets. The nanocrystalline graphene has a grain density of about 500 ea/$\mu m^2$ or higher and a root-mean-square (RMS) roughness in a range of about 0.1 or more to about 1.0 or less.

In some embodiments, a thickness of the nanocrystalline graphene may be about 10 nm or less. For example, a thickness of the nanocrystalline graphene may be about 2 nm or less.

In some embodiments, in a Raman spectrum of the nanocrystalline graphene, a D/G peak ratio may be about 1.0 or higher, and a 2D/G peak ratio may be about 0.1 or higher.

In some embodiments, the nanocrystalline graphene may be graphene-on-substrate formed on a non-catalytic substrate.

In some embodiments, the nanocrystalline graphene may be directly grown on a non-catalytic substrate by a plasma chemical vapor deposition process at a temperature of about 700° C. or lower.

According to an embodiment, a method of forming a nanocrystalline graphene may include injecting a reaction gas including a carbon source gas and an inert gas into a reaction chamber, generating a plasma of the reaction gas in the reaction chamber, and growing nanocrystalline graphene directly on a non-catalytic substrate using the plasma of the reaction gas at a temperature of about 700° C. or lower. The nanocrystalline graphene may include a plurality of grains in a stack of a plurality of graphene sheets. The nanocrystalline graphene may have a grain density of about 500 ea/$\mu m^2$ or higher and a root-mean-square (RMS) roughness in a range of about 0.1 or more to about 1.0 or less.

In some embodiments, the injecting the rejection gas may provide the inert gas into the reaction chamber at a flow rate in a range of about 600 sccm to about 1600 sccm.

In some embodiments, the reaction gas may not include hydrogen gas or may further include hydrogen gas. When the reaction gas further includes hydrogen gas, a volume ratio of the carbon source gas, the inert gas, and the hydrogen gas may be in a range of about 1:0.01 to 5000:0 to 300.

In some embodiments, the carbon source gas may include at least one of hydrocarbon gas and vapor of a liquid precursor including carbon. The inert gas may include at least one of argon gas, neon gas, nitrogen gas, helium gas, krypton gas, and xenon gas.

In some embodiments, the growing the nanocrystalline graphene may performed at a processing temperature in a range of about 180° C. to about 700° C.

In some embodiments, the growing nanocrystalline graphene may be performed at a processing pressure in a range of about 0.001 Torr to about 10 Torr.

In some embodiments, the generating the plasma of the reaction gas in the chamber may be performed using at least one radio frequency (RF) plasma generating device or at least one microwave (MW) plasma generating device. The plasma may include RF plasma having a frequency range of about 3 MHz to about 100 MHz and MW plasma having a frequency range of about 0.7 GHz to about 2.5 GHz.

In some embodiments, a power for the generating plasma of the reaction gas may be in a range of about 10 W to about 4000 W.

In some embodiments, the substrate may include at least one of a Group IV semiconductor material, a semiconductor compound, a metal, and an insulating material.

In some embodiments, the Group IV semiconductor material may include Si, Ge, or Sn. The semiconductor compound may include a material in which at least two of Si, Ge, C, Zn, Cd, Al, Ga, In, B, C, N, P, S, Se, As, Sb, and Te are combined. The metal may include at least one of Cu, Mo, Ni, Al, W, Ru, Co, Mn, Ti, Ta, Au, Hf, Zr, Zn, Y, Cr, and Gd.

In some embodiments, the insulating material may include at least one of Si, Al, Hf, Zr, Zn, Ti, Ta, W, and Mn or at least one of oxides, nitrides, carbides, and derivatives of at least one of Si, Ni, Al, W, Ru, Co, Mn, Ti, Ta, Au, Hf, Zr, Zn, Y, Cr, Cu, Mo, and Gd. The at least one of oxides, nitrides, carbides, and derivatives thereof may further include hydrogen (H).

In some embodiments, the substrate may further include a dopant.

In some embodiments, the method of forming nanocrystalline graphene may further include pretreating a surface of the substrate using a reducing gas before the growing of the nanocrystalline graphene.

In some embodiments, the reducing gas may include at least one of hydrogen, nitrogen, chlorine, fluorine, ammonia, and a derivative thereof. Here, the reducing gas may further include inert gas.

In some embodiments, the method of forming nanocrystalline graphene may include forming a first nanocrystalline graphene on the non-catalytic substrate, and forming a second nanocrystalline graphene on the nanocrystalline graphene by controlling a mixing ratio of the reaction gas.

In some embodiments, the reaction gas may not include hydrogen gas or may further include hydrogen gas.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
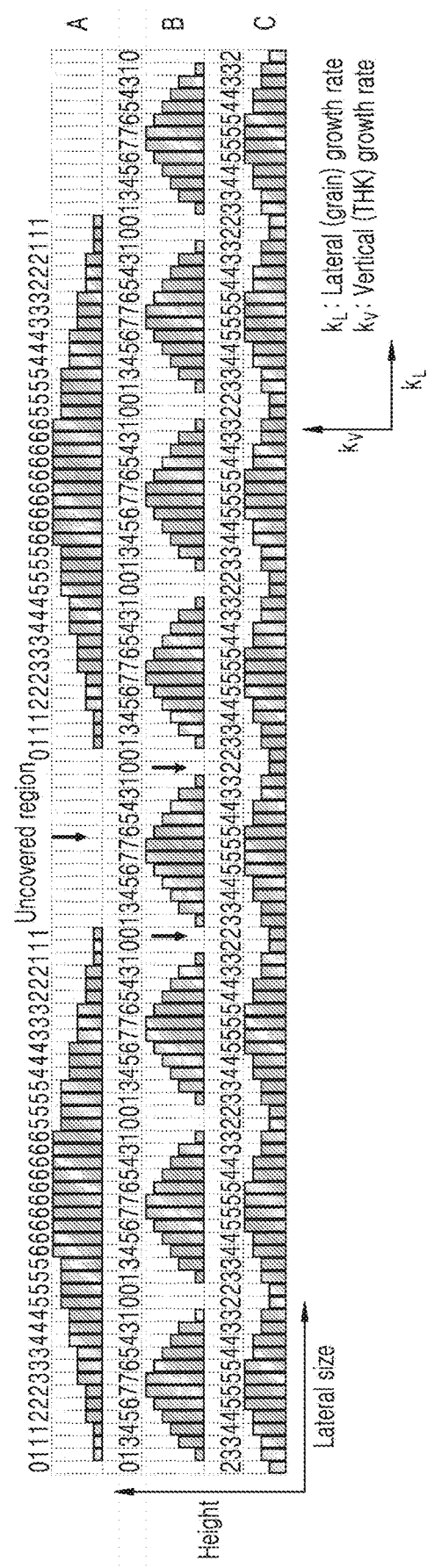
FIG. 1 shows views illustrating growth of nanocrystalline graphene according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, as inventive concepts for various changes and numerous embodiments, particular embodiments will be illustrated in the drawings and described in detail in the written description. However, this is not intended to limit inventive concepts to particular modes of practice, and it is to be appreciated that all changes, equivalents, and substitutes that do not depart from the spirit and technical scope of inventive concepts are encompassed.

The terms used herein are merely used to describe particular embodiments, and are not intended to limit the present inventive concept. An expression used in the singular encompasses the expression of the plural, unless it has a clearly different meaning in the context. As used herein, it is to be understood that the terms such as "including," "having," and "comprising" are intended to indicate the existence of the features, numbers, steps, actions, components, parts, ingredients, materials, or combinations thereof disclosed in the specification, and are not intended to preclude the possibility that one or more other features, numbers, steps, actions, components, parts, ingredients, materials, or combinations thereof may exist or may be added. The symbol '/' used herein may be interpreted as "and" or "or" according to the context.

In the drawings, the thicknesses of layers and regions are exaggerated or reduced for clarity. Like reference numerals in the drawings denote like elements. Throughout the specification, it will be understood that when a component, such as a layer, a film, a region, or a plate, is referred to as being "on" another component, the component may be directly on the other component or intervening components may be present thereon. Throughout the specification, while such terms as "first," "second," etc., may be used to describe various components, such components must not be limited to the above terms. The above terms are used only to distinguish one component from another.

Hereinafter, according to one or more embodiments, nanocrystalline graphene and a method of forming the nanocrystalline graphene will be described in detail.

The nanocrystalline graphene according to an embodiment includes a plurality of grains in a stack of a plurality of graphene sheets and has a grain density of about 500 ea/µm$^2$ or higher (e.g., greater than or equal to about 500 ea/µm$^2$ and less than or equal to about 1500 ea/µm$^2$, but not limited thereto) and a root-mean-square (RMS) roughness in a range of about 0.1 or more to about 0.1 or less.

The grains may include crystals having a nano-scale size, for example, crystals having a size of about 100 nm or less.

Due to device scaling limitation of existing materials, research on applicability of graphene has been conducted, and the graphene was confirmed as graphene may be advantageous in various aspects such as barrier and capping/contact layer. There may be a need of a technique of directly growing uniform graphene of a large area for the industrial application.

When graphene is directly grown on a substrate, $CH_3$ radicals need to be adsorbed and then laterally well diffused to increase the grain size. In the case of growing graphene on Si, an adsorption energy is in a range of about 2.6 eV to about 3 eV depending on the presence or absence of a dangling bond in the nearest neighbor, and thus the radicals are not expected to move at the chemisorption site. On the other hand, grain growth on graphene is more dominant than on Si, and since the growth only proceeds on the seed, a root-mean-square (RMS) roughness of the graphene may increase, and a full-covered large-area graphene may not be formed.

FIG. 1 shows views illustrating growth of nanocrystalline graphene according to an embodiment.

As shown in FIG. 1, there may be a difference between physical parameter and coverage according to the morphology. As a result of simulation, the physical parameter and coverage values in regard of example graphene morphologies A, B, and C, which are different from one another, are respectively shown in Table 1.

TABLE 1

| Morphology | Average THK (XPS, nm) | Grain size (AFM, nm) | Grain density (ea/unit area) | RMS (AFM, nm) | $k_L/k_V$ (at single grain) | Coverage (%) |
| --- | --- | --- | --- | --- | --- | --- |
| A | 1.26 | 42 | 2 | 1.23 | 42/6 | 75 |
| B | 1.26 | 12 | 8 | 1.50 | 12/7 | 85.7 |
| C | 1.26 | 12 | 8 | 1.31 | 12/5 | 100 |

A structure that satisfies the full coverage may not be formed using each index of grain size (or density) or RMS in graphene of the same thickness (average thickness). In order to satisfy the barrier properties and resistance properties, a structure of graphene having grain density and RMS of a specific numerical range may be desired.

Therefore, the present inventors could prepare nanocrystalline graphene capable of covering the entirety of a large area on a substrate as a thin layer, the nanocrystalline graphene including a plurality of grains formed by stacking a plurality of graphene sheets to have a grain density of about 500 ea/$\mu m^2$ or higher and a RMS roughness in a range of about 0.1 nm or more to about 1.0 nm or less, and thus have reached the present disclosure.

Figure 2:
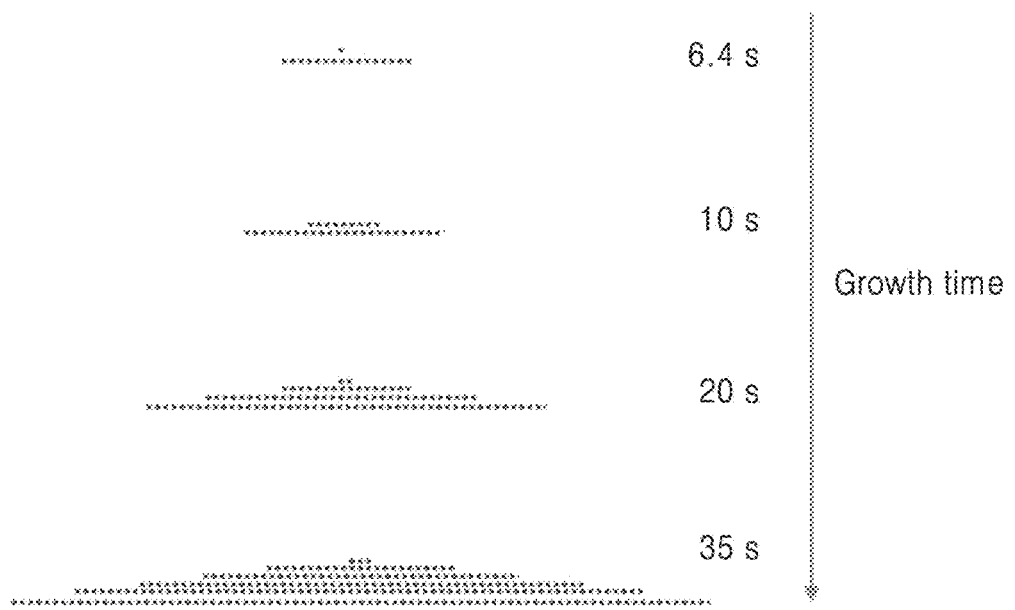
FIG. 2 is an example view illustrating a process of stacking graphene sheets according to growth time of the nanocrystalline graphene according to an embodiment.
Figure 3:
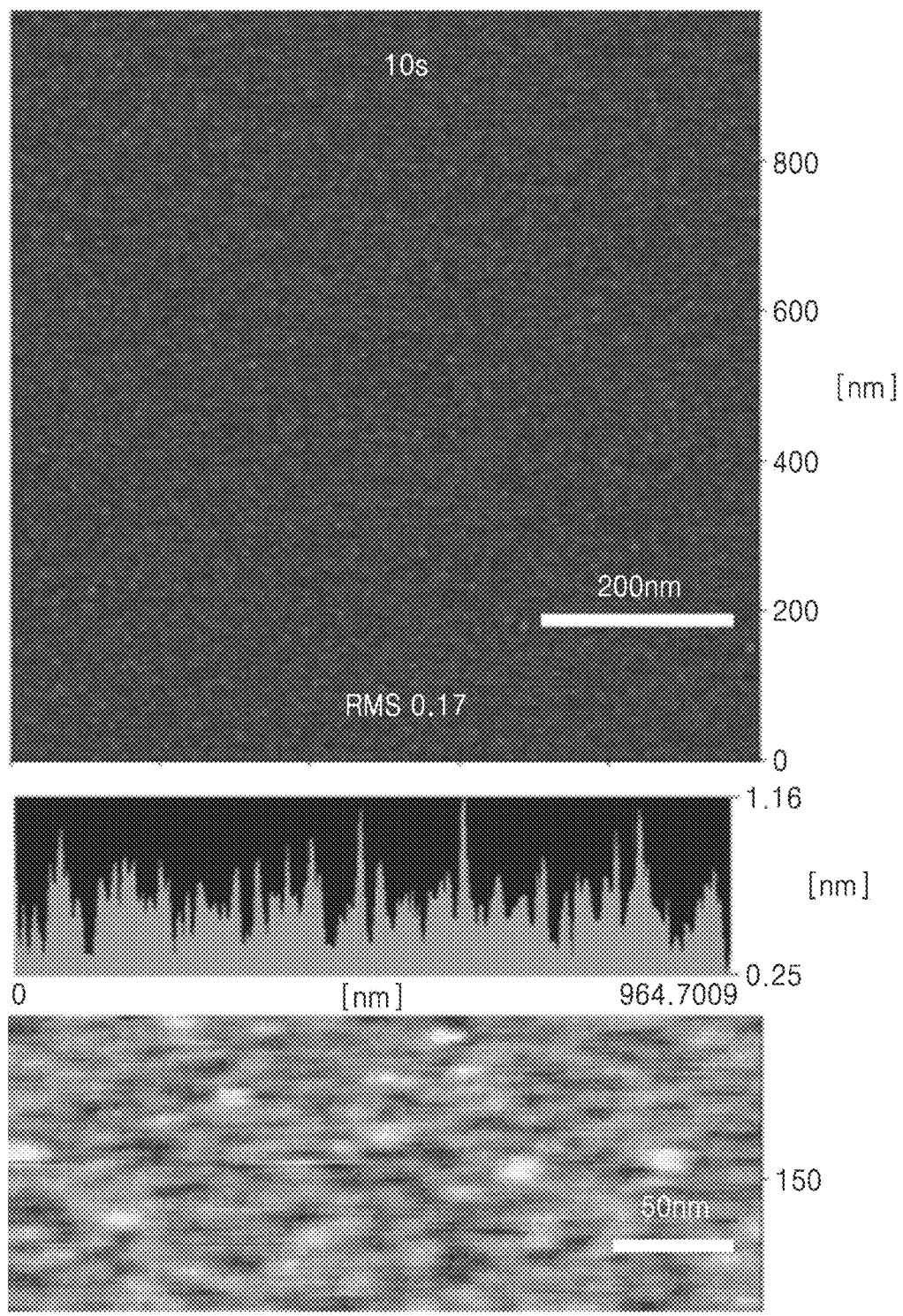
FIGS. 3 to 6 are atomic force microscope (AFM) images showing roughness and thickness of the nanocrystalline graphene grown after 10 seconds, 20 seconds, 35 seconds, and 90 seconds of the growth time, respectively.
Figure 4:
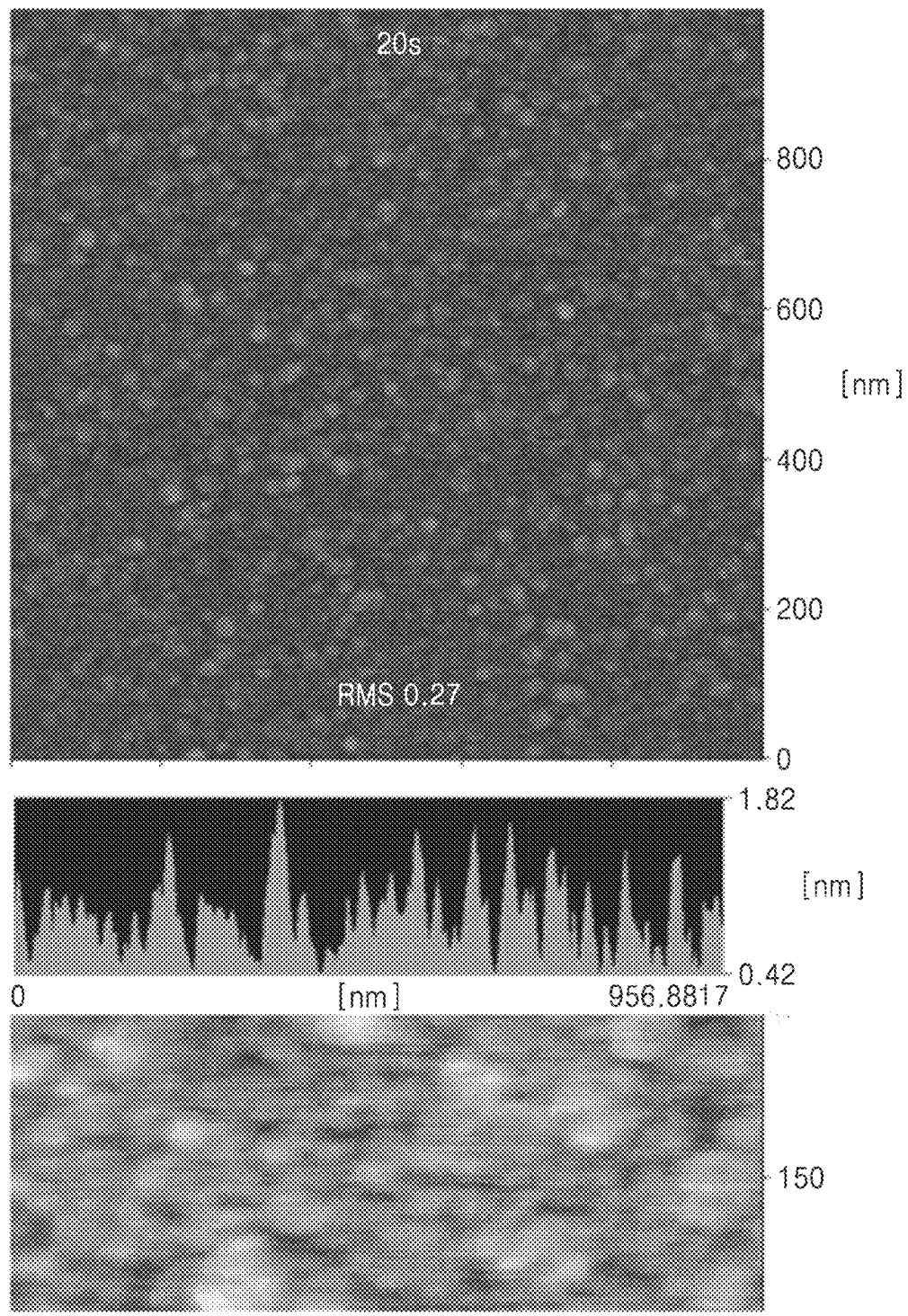
Figure 5:
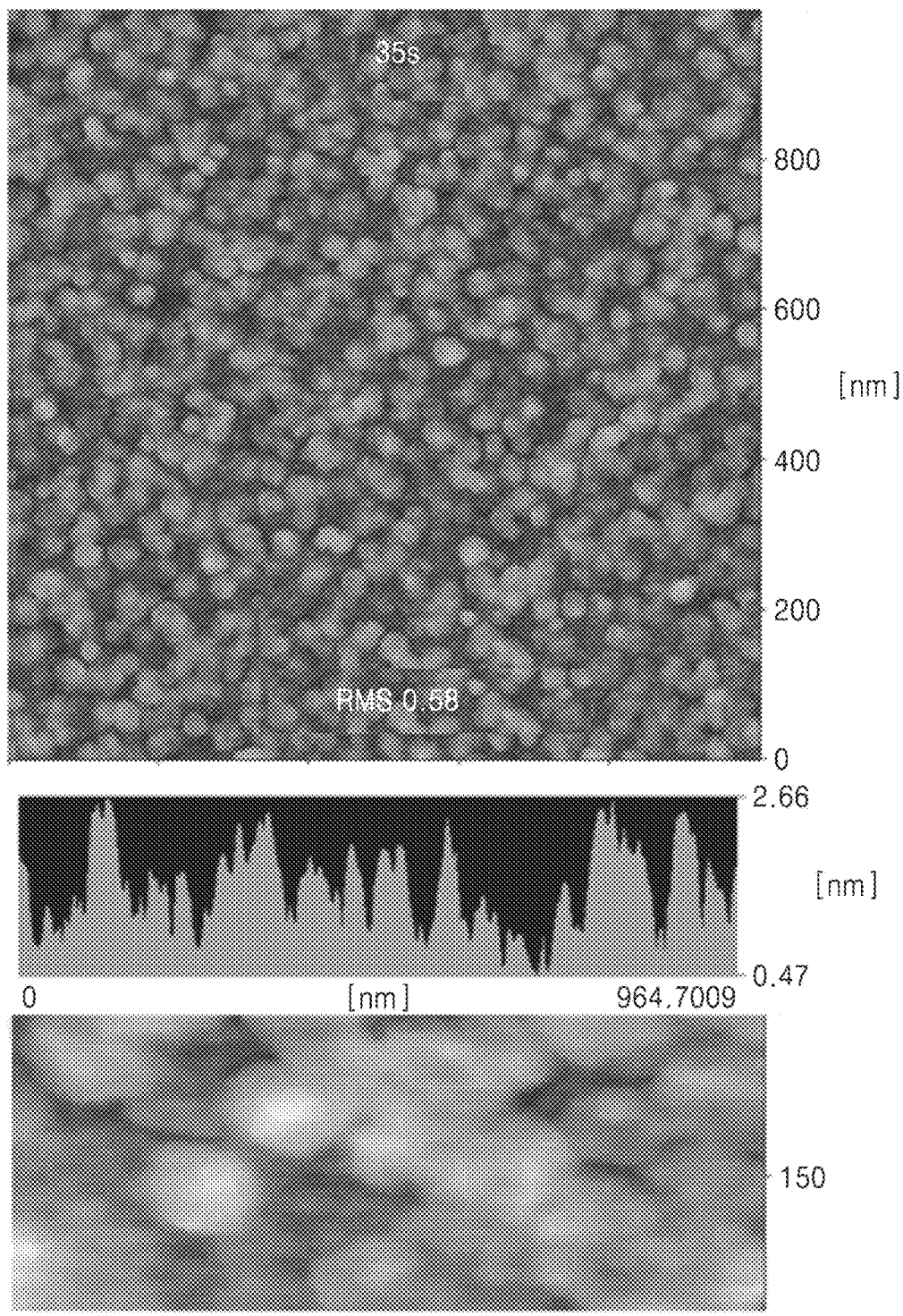

FIG. 2 is an example view illustrating a process of stacking graphene sheets according to growth time of the nanocrystalline graphene according to an embodiment.

FIGS. 3 to 6 are atomic force microscope (AFM) images showing roughness and thickness of the nanocrystalline graphene grown after 10 seconds, 20 seconds, 35 seconds, and 90 seconds of the growth time, respectively.

Figure 6:
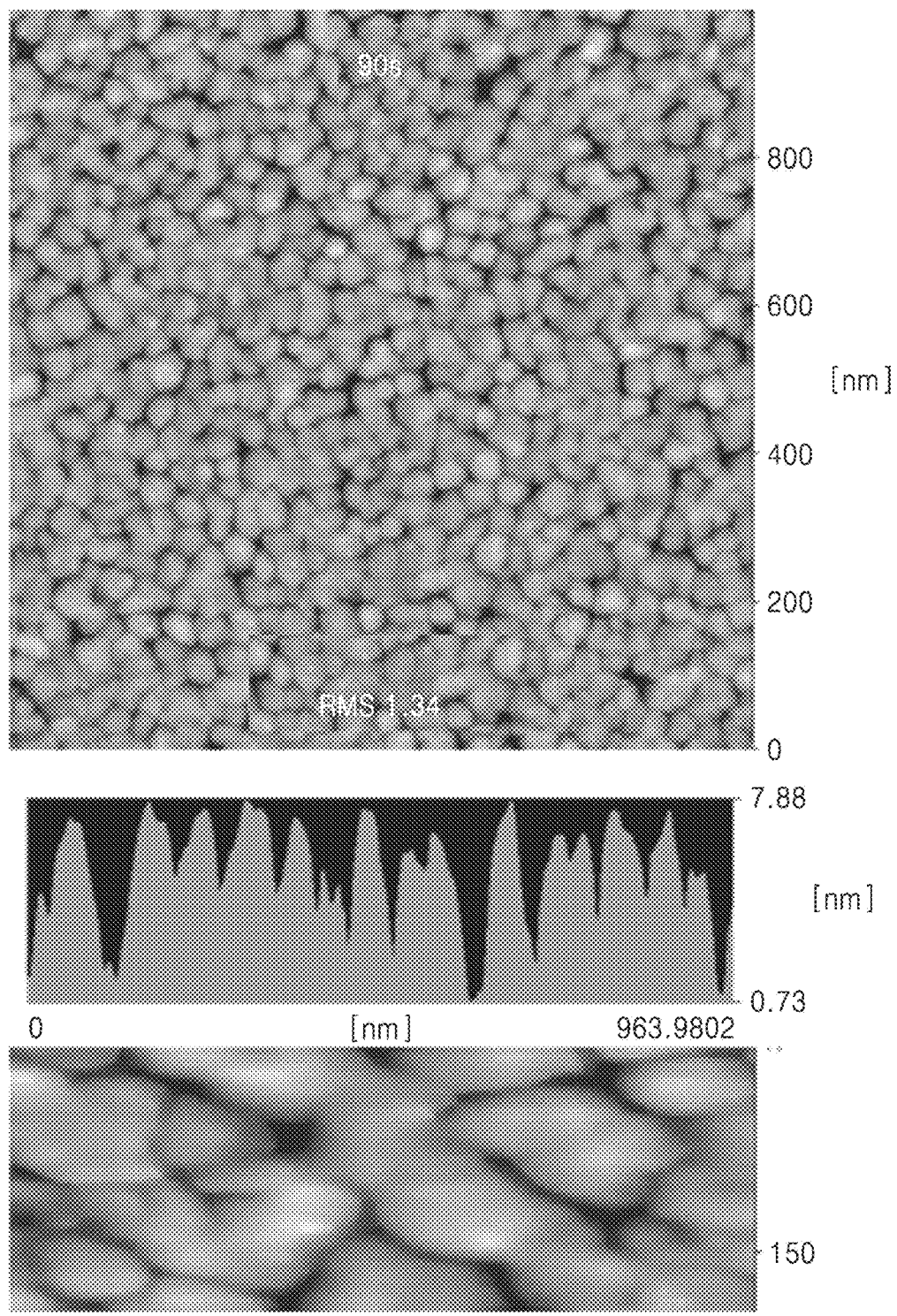

As shown in FIGS. 2 and 6, once the seed is formed, it may be known that the roughness increases according to the growth of graphene on a graphene sheet.

Figure 7:
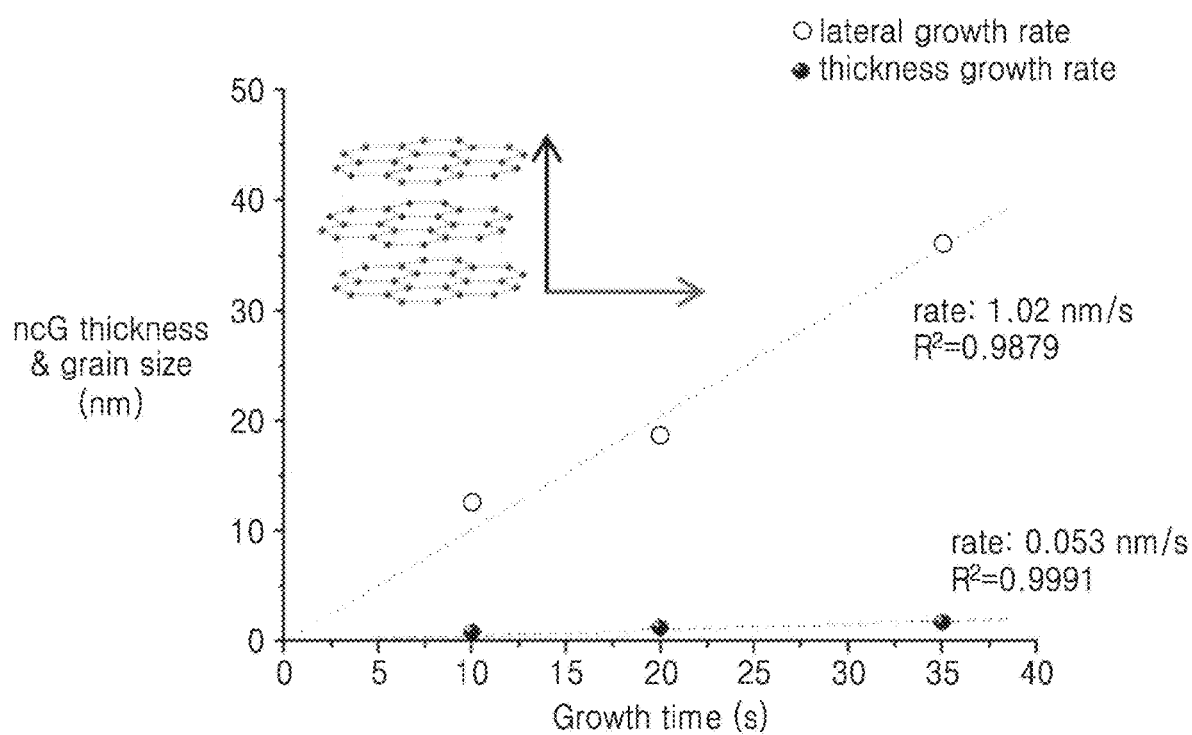
FIG. 7 is a graph that shows thickness and grain size of the nanocrystalline graphene according to the growth time.

FIG. 7 is a graph that shows thickness and grain size of the nanocrystalline graphene according to the growth time; As shown in FIG. 7, it may be known that a lateral growth rate of the nanocrystalline graphene increases faster than a thickness growth rate as the growth time increases.

The nanocrystalline graphene according to an embodiment has a grain density of about 500 ea/$\mu m^2$ or higher and a RMS roughness in a range of about 0.1 nm or more to about 1.0 nm or less and may provide graphene capable of covering the entirety of a large area on a substrate as a thin layer by increasing a grain density of the graphene.

Figure 8:
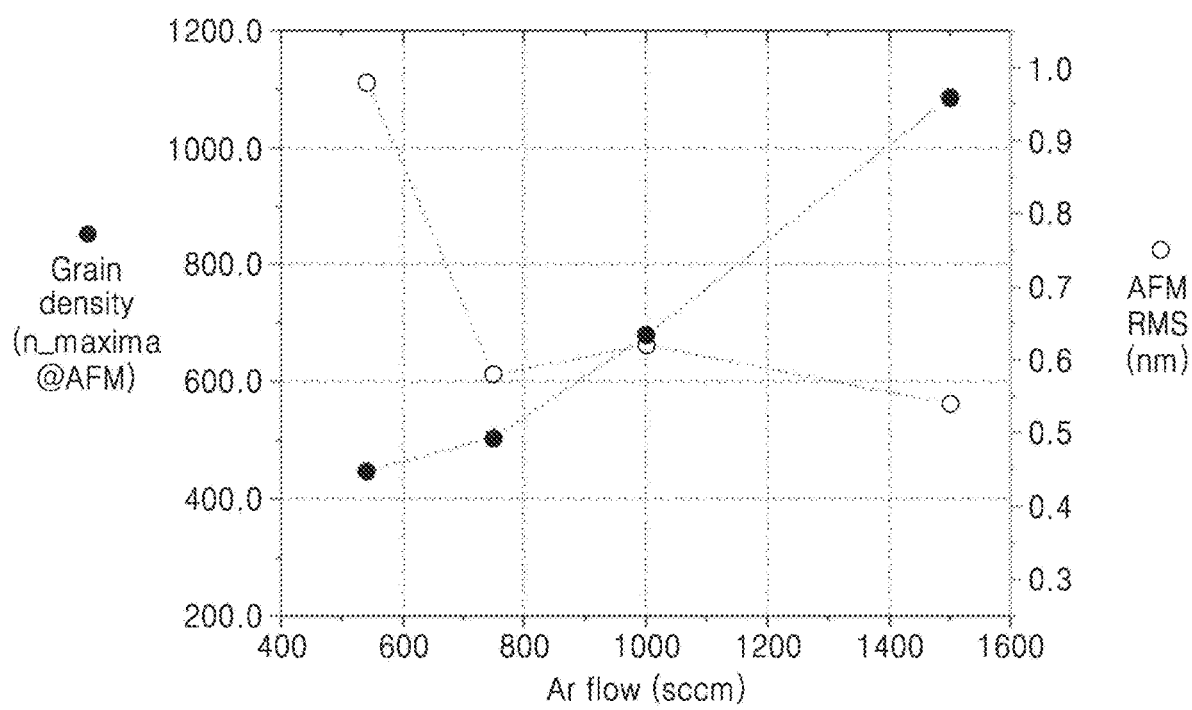
FIG. 8 shows the results of measuring a grain density and a roughness of the nanocrystalline graphene according to a flow rate of Ar flow in a plasma chemical vapor deposition process.

Nanocrystalline graphene is grown by controlling a flow rate of Ar flow in a plasma chemical vapor deposition process according to an embodiment that will be described, and the results of measuring a grain density and a roughness of the nanocrystalline graphene are shown in FIG. 8.

As shown in FIG. 8, it may be known as the flow rate of Ar flow increases, the roughness decreases to a desired and/or alternatively predetermined level or lower while the grain density increases. When the flow rate of Ar flow is lower than about 600 sccm, the prepared nanocrystalline graphene may have a grain density of lower than about 500 ea/$\mu m^2$, which is not appropriate.

Figure 9:
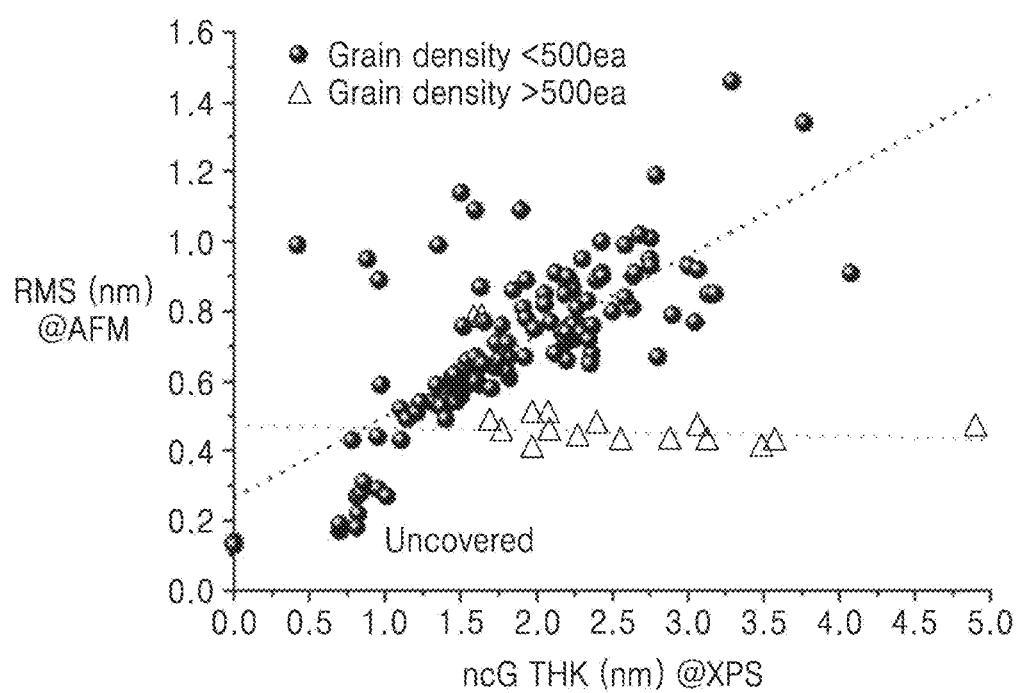
FIG. 9 is a graph that shows the relationship between a thickness and a roughness of nanocrystalline graphene when a grain density is less than about 500 ea/µm$^2$ and about 500 ea/µm$^2$ or higher.

FIG. 9 is a graph that shows the relationship between a thickness and a roughness of nanocrystalline graphene when a grain density is less than about 500 ea/$\mu m^2$ and about 500 ea/$\mu m^2$ or higher. It may be known that when the grain density is lower than about 500 ea/$\mu m^2$, there is a tendency that a roughness increases as a thickness of the nanocrystalline graphene increases, whereas when the grain density is about 500 ea/$\mu m^2$ or higher, an increase in a roughness is limited and/or suppressed in spite of an increase of a thickness of the nanocrystalline graphene, and thus uniform graphene of a high quality may be prepared.

Figure 10:
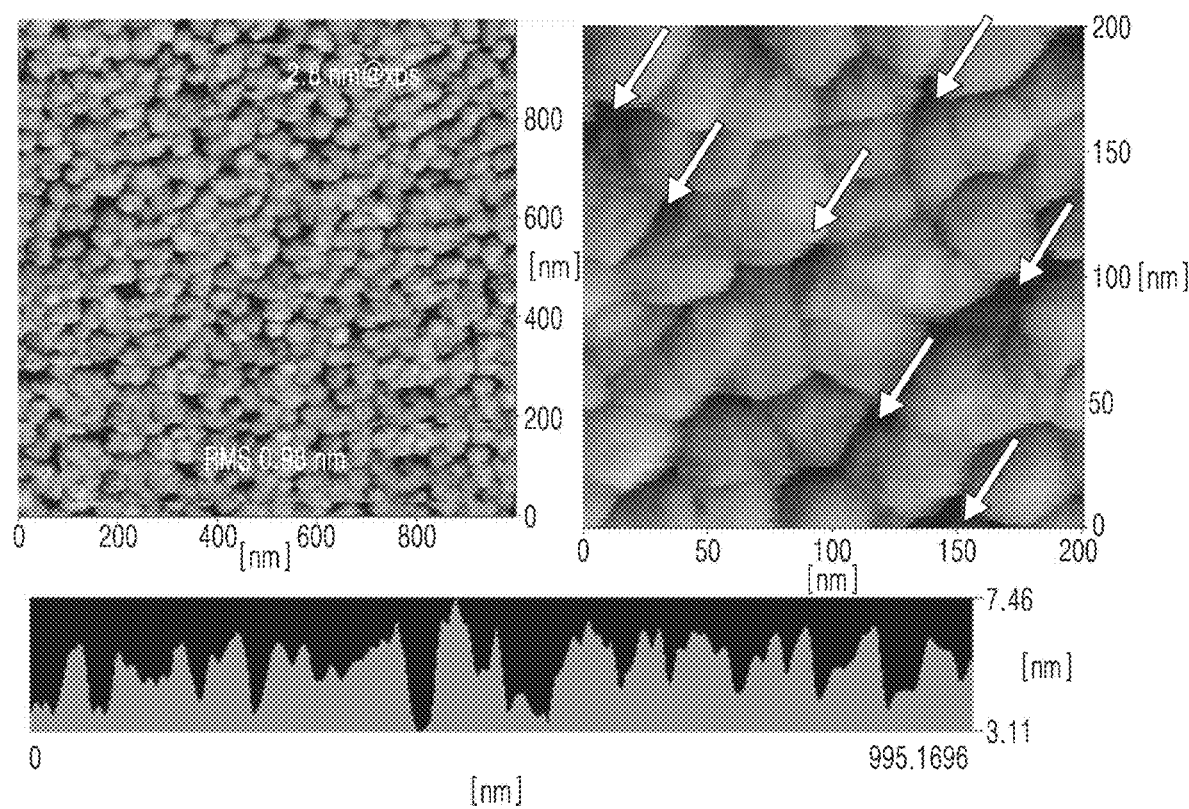
FIG. 10 shows AFM images of nanocrystalline graphene having a grain density of about 430 ea/µm$^2$.
Figure 11:
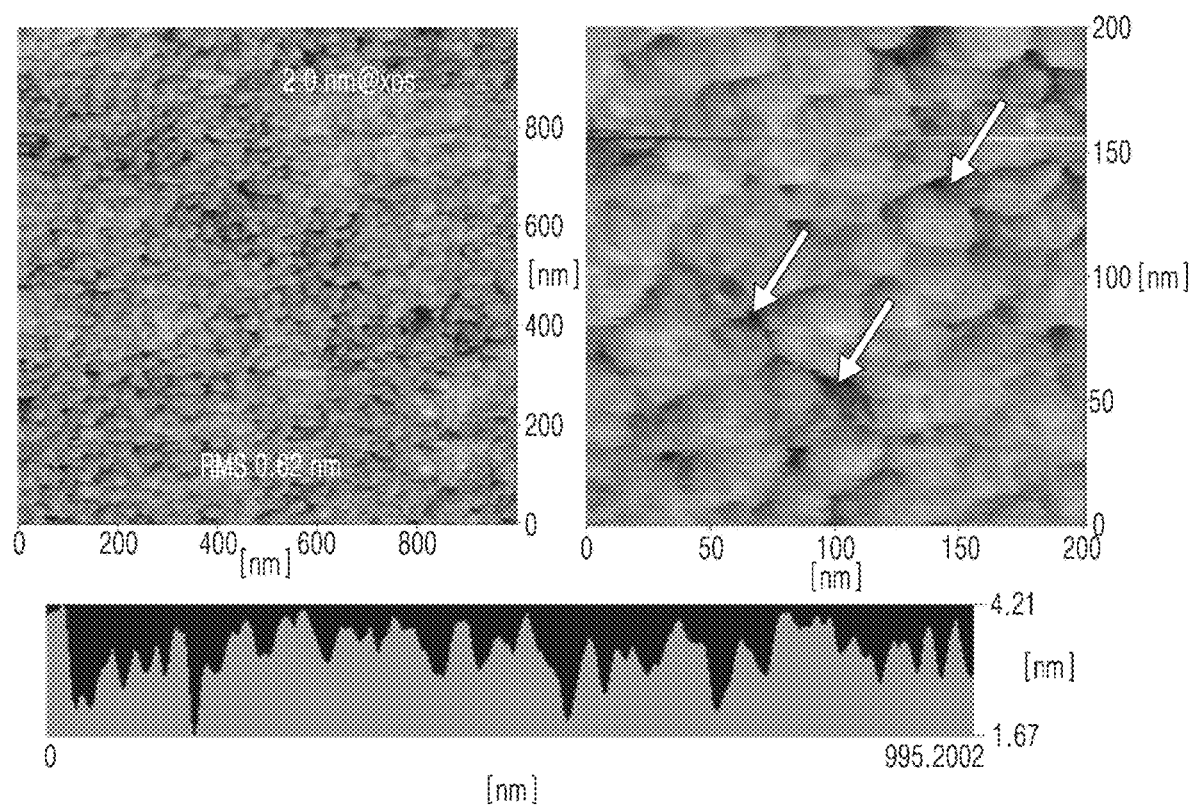
FIG. 11 shows AFM images of nanocrystalline graphene having a grain density of about 680 ea/µm$^2$.
Figure 12:
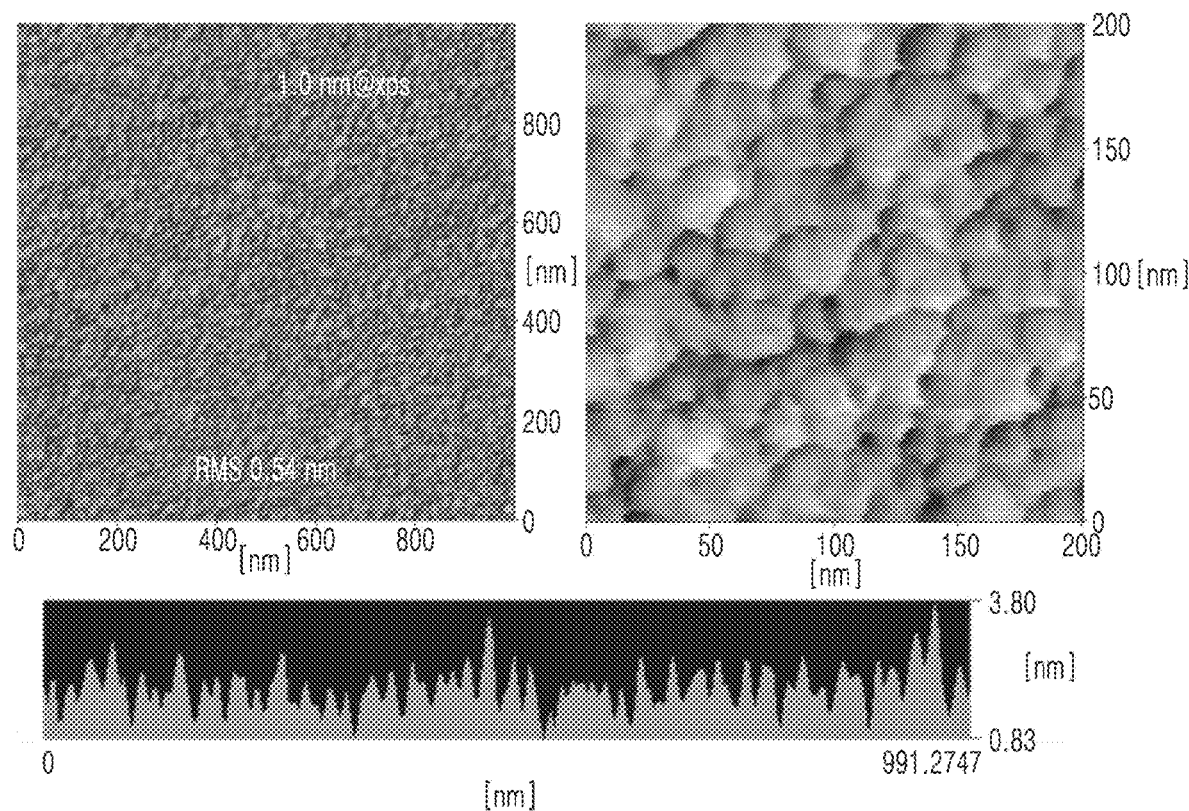
FIG. 12 shows AFM images of nanocrystalline graphene having a grain density of about 1100 ea/µm$^2$.

FIGS. 10 to 12 are AFM images each showing a roughness and a thickness of the nanocrystalline graphene as a part of the results of FIG. 8. FIG. 10 shows AFM images of nanocrystalline graphene having a grain density of about 430 ea/$\mu m^2$, FIG. 11 shows AFM images of nanocrystalline graphene having a grain density of about 680 ea/$\mu m^2$, and FIG. 12 shows AFM images of nanocrystalline graphene having a grain density of about 1100 ea/$\mu m^2$.

As shown in FIG. 10, it may be known that when nanocrystalline graphene has a grain density of about 430 ea/$\mu m^2$ and a RMS of about 0.98 nm, many defect sites, in which no grain is formed between grains, are found as indicated by the arrows, and the areas are also large. This denotes low coverage.

As shown in FIG. 11, when nanocrystalline graphene has a grain density of about 680 ea/$\mu m^2$ and a RMS of about 0.62 nm, defect sites, in which no grain is formed, decreased, and the areas also decreased. This denotes improved coverage.

As shown in FIG. 12, when nanocrystalline graphene has a grain density of about 1100 ea/$\mu m^2$ and a RMS of about 0.54 nm, no defect site is found, and the area is found entirely covered.

From these results, it may be known that when nanocrystalline graphene has a grain density of about 500 ea/$\mu m^2$ or higher and a RMS in a range of about 0.1 or more to about 1.0 or less, and thus the entirety of a large area may be covered with a thin layer of the nanocrystalline graphene.

The nanocrystalline graphene may have a thickness of about 10 nm or less. For example, the nanocrystalline graphene may have a thickness of about 9 nm or less, about 8 nm or less, about 7 nm or less, about 6 nm or less, about 5 nm or less, about 4 nm or less, about 3 nm or less, or about 2 nm or less. Even within the thickness ranges of thin graphene as described above, large-area nanocrystalline graphene having high grain density and improved roughness may be provided.

In some embodiments, a ratio of carbon having a $sp^2$ bonding structure to the total carbon may be obtained by measuring the D-parameter through an X-ray Photoelectron Spectroscopy (XPS) analysis. In particular, a peak shape in the Auger spectrum of carbon may vary according to the ratio of carbon having a sp² bonding structure to the total carbon in the XPS analysis. An interval between the highest point and the lowest point in the D-parameter spectrum obtained by differentiating the peak shapes becomes a D-parameter. In this regard, general crystalline graphene, nanocrystalline graphene, and amorphous carbon layers may be distinguished by measuring the D-parameters in the Auger spectrum of carbon. Also, an amount of hydrogen which will be described may be obtained, for example, through the component analysis using Rutherford Backscattering Spectroscopy (RBS).

General crystalline graphene is also referred to as intrinsic graphene and may include, for example, crystals of a size larger than about 100 nm. In general crystalline graphene, a D-parameter in the Auger spectrum of carbon may be about 23 eV. In this case, a ratio of carbon having a sp² bonding structure to the total carbon may be almost 100%. General crystalline graphene may include little hydrogen. Also, general crystalline graphene may have a density of, for example, about 2.1 g/cc and a sheet resistance, for example, in a range of about 100 Ohm/sq to about 300 Ohm/sq.

On the other hand, the nanocrystalline graphene may include crystals (e.g., grains) of having a smaller size than those of general crystalline graphene. For example, the nanocrystalline graphene may include grains having a grain size in a range of about 0.5 nm to about 100 nm. In particular, for example, the nanocrystalline graphene may include grains having a grain size in a range of about 0.5 nm to about 50 nm. When the grain size is within these ranges, the nanocrystalline graphene may have a high grain density. A D-parameter of the nanocrystalline graphene in the Auger spectrum of carbon may be in a range of about 18 eV to about 22.9 eV. In this case, a ratio of carbon having a sp² bonding structure to the total carbon may be, for example, in a range of about 50% to about 99%. The nanocrystalline graphene may include, for example, hydrogen in a range of about 1 atomic percent (at %) to about 20 at %. Also, a density of the nanocrystalline graphene may be, for example, in a range of about 1.6 g/cc to about 2.1 g/cc, and a sheet resistance of the nanocrystalline graphene may be, for example, about 1000 Ohm/sq or greater.

In the Raman spectrum of the nanocrystalline graphene, a D/G peak ratio may be about 1.0 or higher (e.g., in a range of about 1.0 or higher and about 2.0 or less, but not limited thereto), and a 2D/G peak ratio may be about 0.1 or higher (e.g., in a range of about 0.1 or higher and about 1.0 or less, but not limited thereto). When the peak ratios are within these ranges, graphene may have a high crystallinity.

Figure 15A:
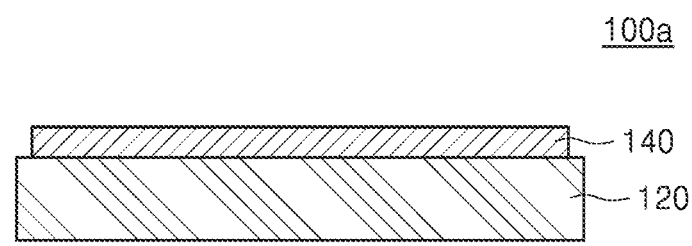
FIGS. 15A to 15F are products including a nanocrystalline graphene according to example embodiments.

The nanocrystalline graphene may be graphene-on-substrate formed on a non-catalytic substrate. For example, as depicted in FIG. 15A, a graphene-on-substrate 100a according to an example embodiment may include a nanocrystalline graphene 140 formed on an upper surface of a substrate 120. A thickness of the nanocrystalline graphene 140 of the graphene-on-substrate 100a may be in a range of about 1 Å to about 100 Å, and about 10% or less of the graphene-on-substrate is a non-uniformity region with an area about 1×1 cm² or greater (e.g., 1×1 to 2×2 cm², but not limited thereto). When the thickness and the area are within these ranges, nanocrystalline graphene 140 may be prepared with uniformity. The nanocrystalline graphene 140 may be referred to as a nanocrystalline graphene layer.

The non-catalytic substrate 120 may be formed of a material of which bulk solubility of carbon atoms at a temperature of about 1000° C. or lower is about 0.1 or less. For example, the non-catalytic substrate 120 may include at least one selected from a Group IV semiconductor material, a semiconductor compound, a metal, and an insulating material.

In particular, for example, the Group IV semiconductor material may include Si, Ge, or Sn.

The semiconductor compound may include, for example, a material in which at least two of Si, Ge, C, Zn, Cd, Al, Ga, In, B, C, N, P, S, Se, As, Sb, and Te are combined.

The metal may include, for example, at least one of Cu, Mo, Ni, Al, W, Ru, Co, Mn, Ti, Ta, Au, Hf, Zr, Zn, Y, Cr, and Gd.

The insulating material may include, for example, at least one of Si, Al, Hf, Zr, Zn, Ti, Ta, W, and Mn or at least one of oxides, nitrides, carbides, and derivatives of at least one of Si, Ni, Al, W, Ru, Co, Mn, Ti, Ta, Au, Hf, Zr, Zn, Y, Cr, Cu, Mo, and Gd. The at least one of oxides, nitrides, carbides, and derivatives thereof may further include hydrogen (H).

Figure 15B:
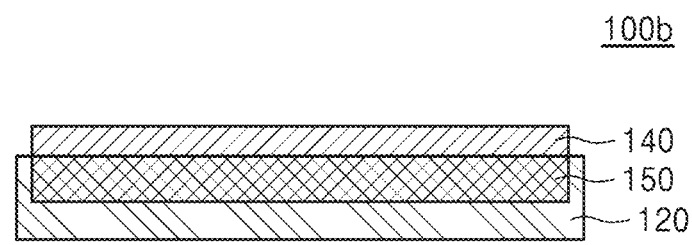

In some embodiments, the non-catalytic substrate 120 may further include a dopant. For example, the non-catalytic substrate 120 may be a doped substrate. Alternatively, as depicted in FIG. 15B, a graphene-on-substrate 100b according to an example embodiment may include a substrate 120 with a doped region 150. The doped region 150 may be a region of the substrate 120 that is doped with a dopant. The dopant may be a different material than a material of the substrate 120 in the area of the substrate 120 outside of the doped region 150. The above-mentioned materials of the substrate are merely examples, and the substrate may include various other materials.

Figure 15C:
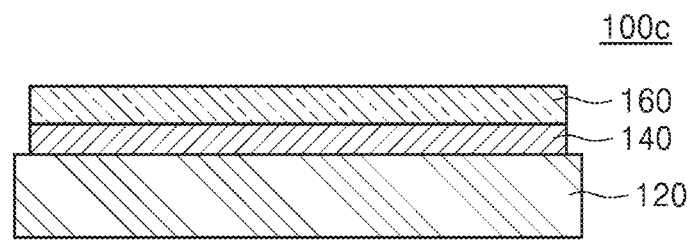

As depicted in FIG. 15C, the graphene-on-substrate 100c may further include a metal layer 160 on the nanocrystalline graphene 140. Since the nanocrystalline graphene has a high coverage and may be directly grown over a large area, a metal layer/graphene/substrate structure that may require low resistance may be prepared by the inclusion of the metal layer.

The graphene-on-substrate 100c further including the metal layer 160 on the nanocrystalline graphene 140 may have improved resistance as diffusion between the metal layer (e.g., W) and the substrate 120 (e.g., Si) is limited by the nanocrystalline graphene fully covering the graphene-on-substrate. The nanocrystalline graphene has a less roughness, and thus a roughness of the metal layer deposited the nanocrystalline graphene may be also be improved.

Figure 13A:
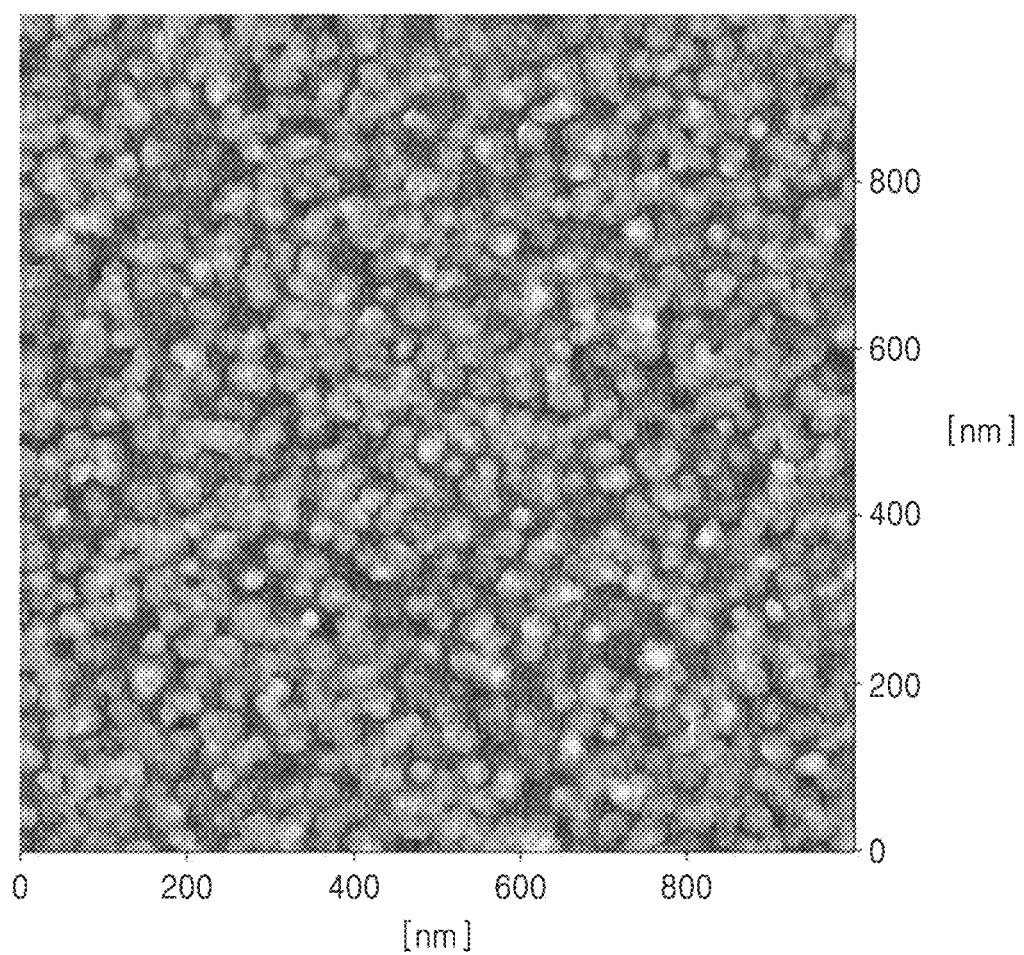
FIG. 13A is an AFM image of a graphene-on-substrate having a low grain density of about 430 ea/µm$^2$.
Figure 13B:
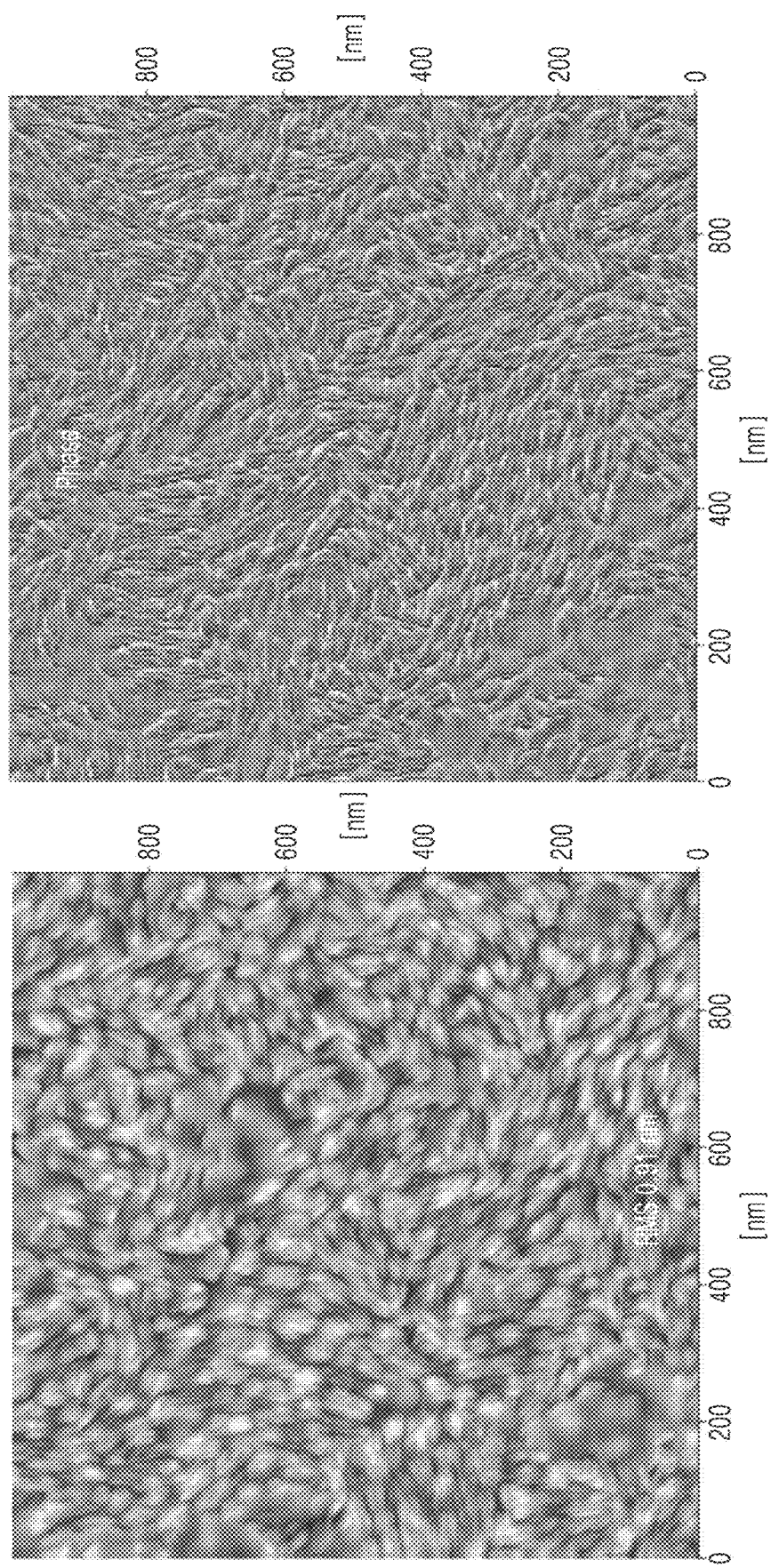
FIG. 13B shows AFM images of the graphene-on-substrate on which tungsten (W) is deposited.

FIG. 13A is an AFM image of graphene-on-substrate having a low grain density of about 430 ea/μm², and FIG. 13B shows AFM images of the graphene-on-substrate on which tungsten (W) is deposited.

As shown in FIGS. 13A and 13B, when tungsten (W) is deposited on a graphene-on-substrate having a low grain density, the roughness (RMS) appeared to be about 0.91 nm, and the resistance (Rs) appeared to be greater than about 15 Ω/sq.

Figure 14A:
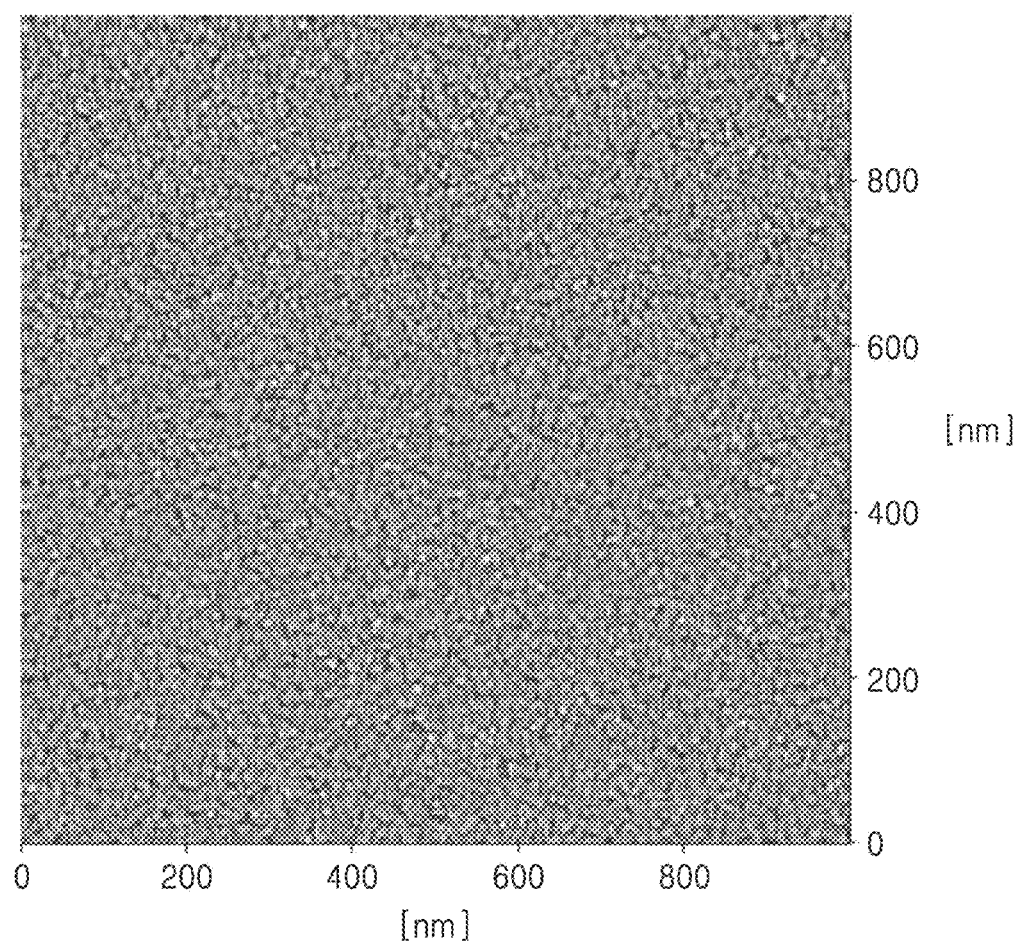
FIG. 14A is an AFM image of a graphene-on-substrate having a high grain density of about 1100 ea/µm$^2$.
Figure 14B:
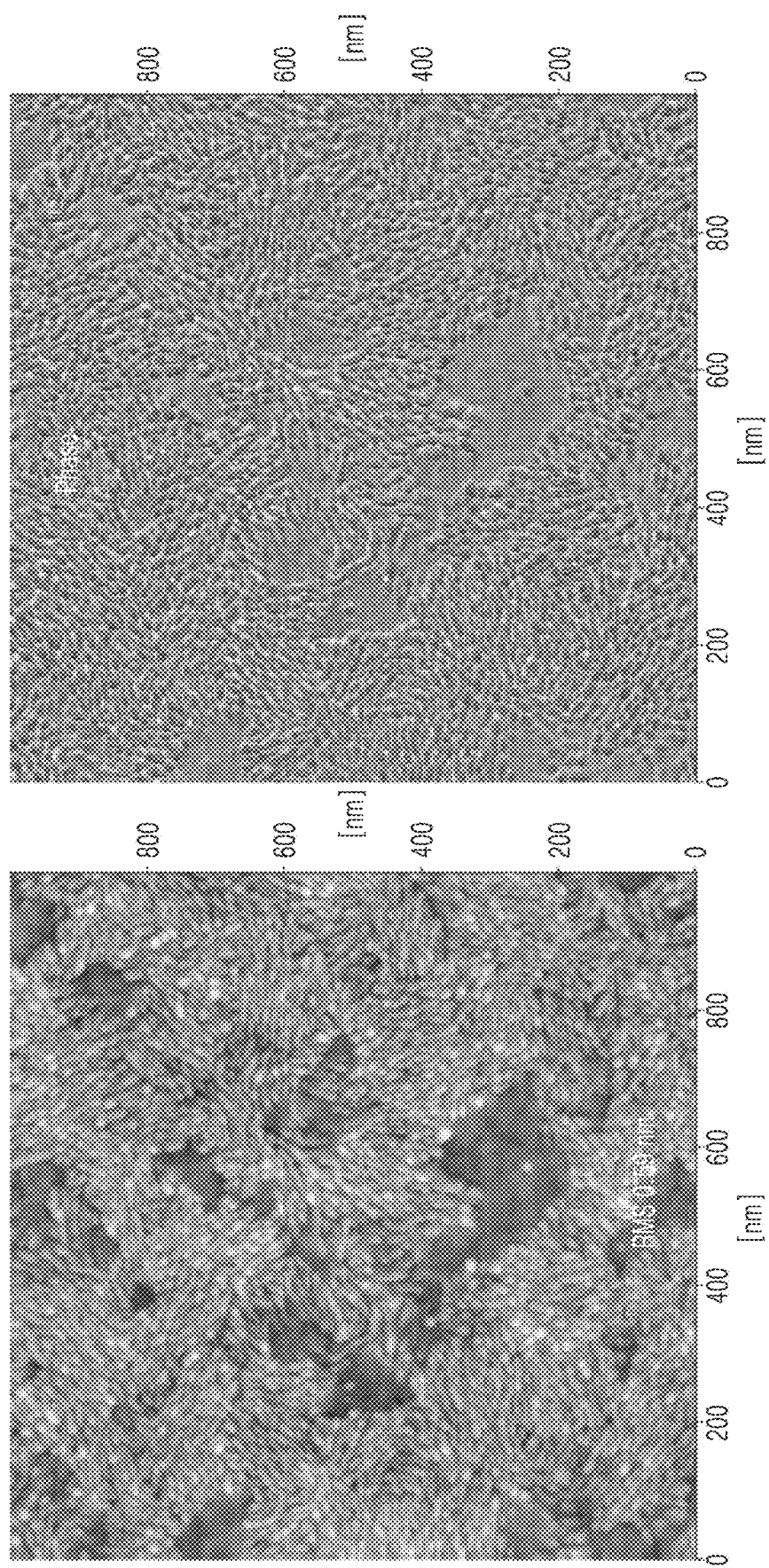
FIG. 14B shows AFM images of the graphene-on-substrate on which tungsten (W) is deposited.

FIG. 14A is an AFM image of a graphene-on-substrate having a high grain density of about 1100 ea/μm², and FIG. 14B shows AFM images of the graphene-on-substrate on which tungsten (W) is deposited.

As shown in FIGS. 14A and 14B, when tungsten (W) is deposited on a graphene-on-substrate having a high grain density, the roughness (RMS) appeared to be about 0.59 nm, and the resistance (Rs) appeared to be about 5.52 Ω/sq.

The nanocrystalline graphene may be directly grown on a non-catalytic substrate by a plasma chemical vapor deposition process using plasma of a reaction gas including carbon source gas and inert gas at a temperature of about 700° C. or lower.

Figure 16:
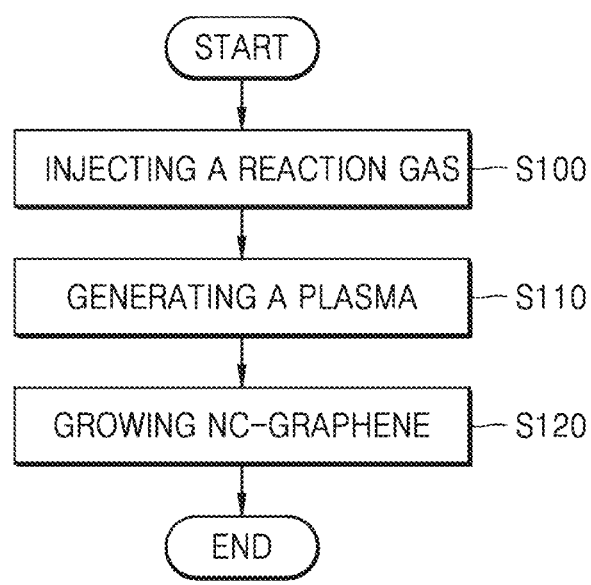
FIG. 16 is a flow chart for a method of forming a nanocrystalline graphene according to example embodiments.

Hereinafter, according to another embodiment, a method of forming nanocrystalline graphene will be described. FIG. 16 is a flow chart for a method of forming a nanocrystalline graphene according to example embodiments.

The method of forming nanocrystalline graphene according to another embodiment includes injecting a reaction gas including carbon source gas and inert gas into a reaction chamber (FIG. 16, S100); generating plasma of the reaction gas in the reaction chamber (FIG. 16, S110); and growing nanocrystalline graphene directly on a non-catalytic substrate using the plasma of the reaction gas at a temperature of about 700° C. or lower (FIG. 16, S120).

After injecting the reaction gas for growing nanocrystalline graphene in a reaction chamber prepared with a non-catalytic substrate therein, power for generating plasma is applied to the reaction chamber.

In particular, first, a substrate for growing nanocrystalline graphene is prepared in a reaction chamber. The substrate used for growing nanocrystalline graphene may be a substrate of various materials and may be, for example, a non-catalytic substrate formed of a material having about 0.1 or less of bulk solubility of carbon atoms at a temperature of about 1000° C. or lower.

For example, the substrate may include at least one selected from a Group IV semiconductor material, a semiconductor compound, a metal, and an insulating material. In particular, the Group IV semiconductor material may include Si, Ge, or Sn. Also, the semiconductor compound may include a material in which at least two of Si, Ge, C, Zn, Cd, Al, Ga, In, B, C, N, P, S, Se, As, Sb, and Te are combined.

The metal may include at least one of Cu, Mo, Ni, Al, W, Ru, Co, Mn, Ti, Ta, Au, Hf, Zr, Zn, Y, Cr, and Gd. The insulating material may include at least one of Si, Al, Hf, Zr, Zn, Ti, Ta, W, and Mn or at least one of oxides, nitrides, carbides, and derivatives of at least one of Si, Ni, Al, W, Ru, Co, Mn, Ti, Ta, Au, Hf, Zr, Zn, Y, Cr, Cu, Mo, and Gd. The at least one of oxides, nitrides, carbides, and derivatives thereof may further include hydrogen (H). In some embodiments, the substrate may further include a dopant. The above-mentioned materials of the substrate are merely examples, and the substrate may include various other materials.

Next, a reaction gas for growing nanocrystalline graphene is injected into the reaction chamber. The reaction gas may include carbon source gas, inert gas, and hydrogen gas. In some embodiments, the reaction gas may not include hydrogen gas. The reaction gas may include, for example, carbon source gas, inert gas, and hydrogen gas.

The carbon source gas may become a source that supplies carbon for growth of the nanocrystalline graphene. For example, the carbon source gas may include at least one of hydrocarbon gas and vapor of a liquid precursor including carbon.

The hydrocarbon gas may include, for example, methane gas, ethylene gas, acetylene gas, or propylene gas, but these are merely examples of the hydrocarbon gas, and gas of various other materials may be included to these examples.

Also, the liquid precursor may include at least one of an aromatic hydrocarbon having a formula of $C_xH_y$ (where $6 \le x \le 42$ and $6 \le y \le 28$) and a derivative thereof; and an aliphatic hydrocarbon having a formula of $C_xH_y$ (where $1 \le x \le 12$ and $2 \le y \le 26$) and a derivative thereof. Here, examples of the aromatic hydrocarbon may include, for example, benzene, toluene, xylene, or anisole, and examples of the aliphatic hydrocarbon may include, for example, hexane, octane, isopropyl alcohol, or ethanol. However, these are mere examples.

For example, the inert gas may include at least one of argon gas, neon gas, nitrogen gas, helium gas, krypton gas, and xenon gas. For example, acetylene gas may be used as the carbon source gas, and argon gas may be used as the inert gas.

A flow rate of the inert gas may be in a range of about 600 sccm to about 1600 sccm. When the flow rate is within this range, nanocrystalline graphene having a high grain density and a less roughness may be grown.

Subsequently, power for generating plasma is applied to the inside of the reaction chamber from a plasma power source. Here, the power for generating plasma may be in a range of about 10 W to about 4000 W. However, embodiments are not limited to this range.

Examples of the plasma power source may include, for example, a radio frequency (RF) plasma generating device or a microwave (MW) plasma generating device. Here, in order to generate nanocrystalline graphene, the RF plasma generating device may generate RF plasma having, for example, a frequency range of about 3 MHz to about 100 MHz, and the MW plasma generating device may generate MW plasma having, for example, a frequency range of about 0.7 GHz to about 2.5 GHz. However, these frequency ranges are merely examples, and other frequency ranges may be used. Alternatively, the plasma power source may include a plurality of RF plasma generating devices or a plurality of MW plasma generating devices.

When power for plasma generation is applied to the inside of the reaction chamber from the plasma power source, an electric field may be induced in the reaction chamber. When an electric field is induced in this manner in the reaction chamber injected with the reaction gas, plasma for growing nanocrystalline graphene is formed.

When nanocrystalline graphene is to be grown using plasma, a mixing ratio, e.g., a volume ratio of the carbon source gas, the inert gas, and the hydrogen gas of the reaction gas injected into the reaction chamber may be, for example, in a range of about 1:0.1 to 5000:0 to 300. Here, the volume ratio of the carbon source gas, the inert gas, and the hydrogen gas in the reaction gas may be appropriately controlled according to other growth conditions of the graphene.

A processing temperature for growing the nanocrystalline graphene may be about 700° C. or lower, which is lower than a temperature at which a general chemical vapor deposition process is performed. In particular, for example, a processing temperature in the reaction chamber may be in a range of about 180° C. to about 700° C. Also, a processing pressure for growing the nanocrystalline graphene may be about 0.001 Torr to about 10 Torr. However, this pressure is a mere example, and other processing pressure may be used.

Carbon radicals (C•) activated by the plasma of the reaction gas including the carbon source gas, the inert gas, and the hydrogen gas mixed therein may be formed in the reaction chamber and adsorbed on the surface of the substrate. In particular, plasma of the inert gas in the reaction gas generates active carbon radicals (C•) from the carbon source gas, and the activated carbon radicals (C•) are adsorbed on the surface of the substrate, thereby activating the surface of the substrate. Also, as the plasma of the inert gas continuously induces the activation of the substrate, adsorption of the activated carbon radicals (C•) on the surface of the substrate may be accelerated.

As the adsorption of activated carbon radicals (C•) on the surface of the substrate is accelerated, nanocrystalline graphene may be grown and formed on the surface of the substrate in a short period of time.

Accordingly, the nanocrystalline graphene may be grown on the surface of the substrate at a relatively high rate. For example, nanocrystalline graphene may be grown at a thickness of about 0.05 nm or more per minute on the surface of the substrate. However, embodiments are not limited thereto. In this regard, nanocrystalline graphene may be grown to a desired thickness in a relatively short period of time. For example, a time for growing the nanocrystalline graphene on the surface of the substrate may be, for example, about 60 minutes or less. In particular, for example, a time for growing the nanocrystalline graphene on the surface of the substrate may be about 30 minutes or less or about 10 minutes or less. However, embodiments are not limited thereto. In this regard, nanocrystalline graphene of a desired thickness may be directly formed on a surface of a substrate within a relatively short period of time by using plasma of inert gas. The nanocrystalline graphene may be a single layer or may have a multi-layer structure.

According to the present embodiment, when a reaction gas in a plasma chemical vapor deposition process includes carbon source gas, inert gas, and hydrogen gas, and a surface of a substrate is activated by plasma of the inert gas, nanocrystalline graphene may be directly formed on the surface of the substrate at a relatively low temperature of about 700° C. or lower within a relatively short period of time.

According to another embodiment, a method of forming nanocrystalline graphene will be described.

According to another embodiment, a pretreatment process may be performed on a surface of a substrate first using a reducing gas before growing nanocrystalline graphene. Here, the pretreatment process of the substrate may be performed for the purpose of removing impurities or oxygen remaining on the surface of the substrate.

In particular, first, a substrate for growing nanocrystalline graphene thereon is prepared in a reaction chamber. Here, the substrate may include various materials in addition to the materials described above.

Next, a gas for pretreatment of the substrate is injected into the reaction chamber. Here, the gas for pretreatment may be a reducing gas. Here, the reducing gas may include, for example, at least one of hydrogen, nitrogen, chlorine, fluorine, ammonia, and a derivative thereof. However, embodiments are not limited thereto. Also, inert gas may further be injected into the reaction chamber in addition to the reducing gas. Here, the inert gas may include, for example, at least one of argon gas, neon gas, helium gas, krypton gas, and xenon gas. For example, the reducing gas may be hydrogen gas, and the inert gas may be argon gas.

Then, power for generating plasma is applied to the inside of the reaction chamber from a plasma power source. Here, the power for generating plasma may be in a range of about 10 W to about 4000 W, but embodiments are not limited thereto. The plasma power source may be, for example, at least one RF plasma generating device or at least one MW plasma generating device.

When the power for generating plasma is applied to the inside of the reaction chamber from the plasma power source, an electric field may be induced in the reaction chamber. When an electric field is induced in this manner in the reaction chamber injected with the reducing gas (or a mixture gas of a reducing gas and an inert gas), plasma for pretreating the substrate is formed. A surface of the substrate may be pretreated using the plasma thus formed. In some embodiments, the pretreatment process of the substrate may be performed in a state in which a desired and/or alternatively predetermined voltage is applied to the substrate. However, embodiments are not limited thereto, and a voltage may not be applied to the substrate. Accordingly, impurities or oxygen remaining on the surface of the substrate may be removed. Once the pretreatment process on the substrate is completed, gases or impurities remaining in the reaction chamber may be discharged to the outside of the reaction chamber.

After completing the pretreatment process on the substrate, the reaction gas for growing nanocrystalline graphene is injected into the reaction chamber, and the power for generating plasma is applied to the inside of the reaction chamber.

In particular, for example, the reaction gas for growing nanocrystalline graphene is first injected into the reaction chamber. The reaction gas may include carbon source gas, inert gas, and hydrogen gas. In some embodiments, the reaction gas may not include hydrogen gas. For example, the reaction gas may include carbon source gas, inert gas, and hydrogen gas.

The carbon source gas may include at least one of hydrocarbon gas and vapor of a liquid precursor including carbon. The hydrocarbon gas may include, for example, methane gas, ethylene gas, acetylene gas, or propylene gas, but these are merely examples of the hydrocarbon gas.

The liquid precursor may include, for example, at least one of an aromatic hydrocarbon having a formula of $C_xH_y$ (where $6 \le x \le 42$ and $6 \le y \le 28$) and a derivative thereof; and an aliphatic hydrocarbon having a formula of $C_xH_y$ (where $1 \le x \le 12$ and $2 \le y \le 26$) and a derivative thereof. Here, examples of the aromatic hydrocarbon may include, for example, benzene, toluene, xylene, or anisole, and examples of the aliphatic hydrocarbon may include, for example, hexane, octane, isopropyl alcohol, or ethanol. However, these are mere examples.

The inert gas may include, for example, at least one of argon gas, neon gas, nitrogen gas, helium gas, krypton gas, and xenon gas. For example, acetylene gas may be used as the carbon source gas, and argon gas may be used as the inert gas.

Subsequently, power for generating plasma is applied to the inside of the reaction chamber from a plasma power source. Here, the power for generating plasma may be in a range of about 10 W to about 4000 W. The plasma power source may be, for example, at least one RF plasma generating device or at least one MW plasma generating device. Here, the RF plasma generating device may generate RF plasma having, for example, a frequency range of about 3 MHz to about 100 MHz, and the MW plasma generating device may generate MW plasma having, for example, a frequency range of about 0.7 GHz to about 2.5 GHz. However, embodiments are not limited thereto. When power for plasma generation is applied to the inside of the reaction chamber from the plasma power source, an electric field may be induced in the reaction chamber. When an electric field is induced in this manner in the reaction chamber injected with the reaction gas, plasma for growing nanocrystalline graphene is formed.

When nanocrystalline graphene is to be grown using plasma, a mixing ratio, e.g., a volume ratio of the carbon source gas, the inert gas, and the hydrogen gas of the reaction gas injected into the reaction chamber may be, for example, in a range of about 1:0.1 to 5000:0 to 300. Here, the volume ratio of the carbon source gas, the inert gas, and the hydrogen gas in the reaction gas may be appropriately controlled according to other growth conditions of the graphene.

A processing temperature may be in a range of about 180° C. to about 700° C., and a processing pressure may be about 0.001 Torr to about 10 Torr. However, these are mere examples, and other processing temperatures or processing pressures may be used.

When an electric field is induced in this manner in the reaction chamber injected with the reaction gas as described above, plasma for growing nanocrystalline graphene is formed. The plasma of the inert gas in the reaction gas generates active carbon radicals from the carbon source gas, and the activated carbon radicals are adsorbed on the surface of the substrate, thereby activating the surface of the substrate. Also, as the plasma of the inert gas continuously induces the activation of the substrate, adsorption of the activated carbon radicals on the surface of the substrate may be accelerated.

As the adsorption of activated carbon radicals on the surface of the substrate is accelerated as described above, nanocrystalline graphene may be grown and formed on the surface of the substrate in a short period of time.

Thus, the nanocrystalline graphene may be grown on the surface of the substrate at a relatively high rate. For example, nanocrystalline graphene may be grown at a thickness of about 0.05 nm or more per minute on the surface of the substrate, but embodiments are not limited thereto. Accordingly, nanocrystalline graphene may be grown to a desired thickness in a relatively short period of time, for example, about 60 minutes or less (for example, about 30 minutes or less or about 10 minutes or less). In this regard, nanocrystalline graphene may be grown to a desired thickness in a relatively short period of time. The nanocrystalline graphene may be a single layer or may have a multi-layer structure.

According to the present embodiment, when a surface of a substrate is pretreated using a reducing gas (or a mixture gas of a reducing gas and an inert gas) and then nanocrystalline graphene is grown on the surface of the pretreated substrate, nanocrystalline graphene of relatively high quality may be obtained.

According to another embodiment, a method of forming nanocrystalline graphene will be described.

According to another embodiment, after injecting a first reaction gas into a reaction chamber in which a substrate is prepared, power for generating plasma is applied to the reaction chamber. In some embodiments, a pretreatment process may be performed on the substrate before the injecting of the first reaction gas.

In particular, first, a substrate is prepared in a reaction chamber. As described above, the substrate may include, for example, at least one of a Group IV semiconductor material, a semiconductor compound, a metal, and an insulating material. The substrate may further include a dopant. However, embodiments are not limited thereto.

Next, a first reaction gas is injected into the reaction chamber. Here, the first reaction gas may be a reaction gas for growing first nanocrystalline graphene that will be described. For example, the first reaction gas may include the carbon source gas, the inert gas, and the hydrogen gas. In some embodiments, the first reaction gas may not include hydrogen gas. The first reaction gas may include a carbon source gas, an inert gas, and hydrogen gas.

For example, the carbon source gas may include at least one of hydrocarbon gas and vapor of a liquid precursor including carbon. Here, the hydrocarbon gas may include, for example, methane gas, ethylene gas, acetylene gas, or propylene gas. Also, the liquid precursor may include at least one of an aromatic hydrocarbon having a formula of $C_xH_y$ (where $6 \le x \le 42$ and $6 \le y \le 28$) and a derivative thereof; and an aliphatic hydrocarbon having a formula of $C_xH_y$ (where $1 \le x \le 12$ and $2 \le y \le 26$) and a derivative thereof.

For example, the inert gas may include at least one of argon gas, neon gas, nitrogen gas, helium gas, krypton gas, and xenon gas. For example, acetylene gas may be used as the carbon source gas, and argon gas may be used as the inert gas.

Subsequently, power for generating plasma is applied to the inside of the reaction chamber from a plasma power source. Here, the power for generating plasma may be in a range of about 10 W to about 4000 W. The plasma power source may be, for example, at least one RF plasma generating device or at least one MW plasma generating device. Here, the RF plasma generating device may generate RF plasma having, for example, a frequency range of about 3 MHz to about 100 MHz, and the MW plasma generating device may generate MW plasma having, for example, a frequency range of about 0.7 GHz to about 2.5 GHz. However, embodiments are not limited thereto.

When power for plasma generation is applied to the inside of the reaction chamber from the plasma power source, an electric field may be induced in the reaction chamber. When an electric field is induced in this manner in the reaction chamber injected with the first reaction gas, plasma for growing first nanocrystalline graphene is formed.

When first nanocrystalline graphene is to be grown using plasma, a mixing ratio, e.g., a volume ratio of a carbon source gas, an inert gas, and hydrogen gas of the first reaction gas injected into the reaction chamber may be, for example, in a range of about 1:0.1 to 5000:0 to 300.

For example, the volume ratio of the carbon source gas, the inert gas, and the hydrogen gas in the first reaction gas may be controlled to further activate the surface of the substrate so that a nucleation density may be increased. A processing temperature may be in a range of about 180° C. to about 700° C., and a processing pressure may be about 0.01 Torr to about 10 Torr. However, embodiments are not limited thereto.

As described above, when an electric field is induced in the reaction chamber injected with the first reaction gas, plasma for growing first nanocrystalline graphene is formed. Also, the plasma of the inert gas in the first reaction gas generates active carbon radicals from the carbon source gas, and the activated carbon radicals are adsorbed on the surface of the substrate, thereby activating the surface of the substrate. As the plasma of the inert gas continuously induces the activation of the substrate, adsorption of the activated carbon radicals on the surface of the substrate may be accelerated.

As the adsorption of activated carbon radicals on the surface of the substrate is accelerated, first nanocrystalline graphene may be grown and formed on the surface of the substrate. Thus, the first nanocrystalline graphene may be grown on the surface of the substrate at a relatively high rate. The first nanocrystalline graphene may be a single layer or may have a multi-layer structure. Once the formation of the first nanocrystalline graphene is completed, gases remaining in the reaction chamber may be discharged to the outside of the reaction chamber.

After forming the first nanocrystalline graphene on the surface of the substrate as described above, a second reaction gas is injected into the reaction chamber for forming second nanocrystalline graphene, and then power for generating plasma is applied to the reaction chamber.

In particular, first, a second reaction gas is injected into the reaction chamber. Here, the second reaction gas may be a reaction gas for growing second nanocrystalline graphene that will be described. As well as the first reaction gas described above, the second reaction gas may include a carbon source gas, an inert gas, and hydrogen gas. In some embodiments, the second reaction gas may not include hydrogen gas.

As described above, the carbon source gas may include, for example, at least one of hydrocarbon gas and vapor of a liquid precursor including carbon. Also, the inert gas may include at least one of argon gas, neon gas, nitrogen gas, helium gas, krypton gas, and xenon gas. For example, acetylene gas may be used as the carbon source gas, and argon gas may be used as the inert gas.

Subsequently, power for generating plasma is applied to the inside of the reaction chamber from a plasma power source. Here, the power for generating plasma may be in a range of about 10 W to about 4000 W. As described above, the plasma power source may be at least one RF plasma generating device or at least one MW plasma generating device. When power for plasma generation is applied to the inside of the reaction chamber from the plasma power source, an electric field may be induced in the reaction chamber. When an electric field is induced in this manner in the reaction chamber injected with the second reaction gas, plasma for growing second nanocrystalline graphene is formed.

When second nanocrystalline graphene is to be grown using plasma, a mixing ratio, e.g., a volume ratio of a carbon source gas, an inert gas, and hydrogen gas of the second reaction gas injected into the reaction chamber may be, for example, in a range of about 1:0.1 to 5000:0 to 300.

For example, the mixing ratio of the carbon source gas, the inert gas, and the hydrogen gas in the second reaction gas may be controlled differently from that of the first reaction gas. For example, the mixing ratio of the carbon source gas, the inert gas, and the hydrogen gas in the second reaction gas may be controlled such that the second nanocrystalline graphene grows more uniformly than the first nanocrystalline graphene.

A processing temperature may be in a range of about 180° C. to about 700° C., and a processing pressure may be about 0.001 Torr to about 10 Torr. However, embodiments are not limited thereto.

As described above, when an electric field is induced in the reaction chamber injected with the second reaction gas, plasma for growing second nanocrystalline graphene is formed. Also, the plasma of the inert gas in the second reaction gas generates active carbon radicals from the carbon source gas, and the activated carbon radicals may be continuously adsorbed on a surface of the first nanocrystalline graphene formed on the substrate.

As the activated carbon radicals are continuously adsorbed on a surface of the first nanocrystalline graphene, second nanocrystalline graphene may be grown and formed on the surface of the first nanocrystalline graphene. Here, a mixing ratio of a carbon source gas, an inert gas, and hydrogen gas of the second nanocrystalline graphene may be controlled to form the second nanocrystalline graphene with uniformity higher than that of the first nanocrystalline graphene. The second nanocrystalline graphene may be grown to a desired thickness at a relatively high rate on the surface of the first nanocrystalline graphene. The second nanocrystalline graphene may be a single layer or may have a multi-layer structure.

According to the present embodiment, when a growing process of nanocrystalline graphene is performed in two steps by controlling a mixing ratio of a carbon source gas, an inert gas, and hydrogen gas, first nanocrystalline graphene and second nanocrystalline graphene that are different from each other may be sequentially formed on a substrate. In the above embodiment, a case of growing two different nanocrystalline graphene layers on a substrate by performing the growing process twice with two different mixing ratios of a carbon source gas, an inert gas, and hydrogen gas was described as an example. However, embodiments are not limited thereto, and the growing process described above may be performed at least three times to grow and form at least three nanocrystalline graphene layers on a substrate.

According to one or more embodiments described above, nanocrystalline graphene may be directly grown and formed on a surface of a substrate even at a relatively low temperature of about 700° C. or lower in a relatively short period of time by including a carbon source gas, an inert gas, and hydrogen gas in a reaction gas of a plasma chemical vapor deposition process and by activating the surface of the substrate using plasma of the inert gas.

Also, nanocrystalline graphene of excellent quality may be obtained by performing a pretreatment process of the substrate, and a plurality of nanocrystalline graphene layers may be formed on the substrate by performing a several times of nanocrystalline graphene growing processes with different mixing ratios of the carbon source gas, the inert gas, and the hydrogen gas.

The technique of directly growing the nanocrystalline graphene on the surface of the substrate at the relatively low temperature may be applied to a Complementary Metal-Oxide-Semiconductor (CMOS) process, so that the technique may be applied to form an element of a semiconductor device such as a barrier metal or the source/drain contact or to manufacture a pellicle of an exposure apparatus.

Figure 15D:
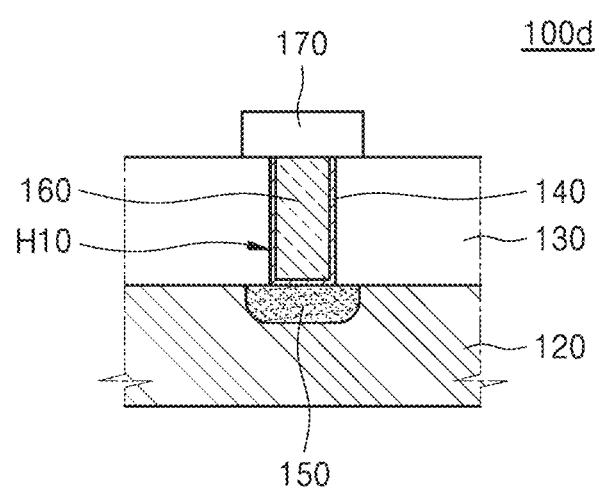

For example, as depicted in FIG. 15D, a device 100d including nanocrystalline graphene 140 as a barrier layer may be provided. The nanocrystalline graphene 140 may be formed on a doped region 150 of a substrate 120, but in some embodiments the doped region 150 may be omitted and the nanocrystalline graphene 140 instead may be formed on the substrate 120 without the doped region 150. The nanocrystalline graphene 140 may be formed directly on the doped region 150 and/or substrate 120. An insulating layer 130 (e.g., silicon oxide) may be formed on the substrate 120 and define a hole H10 extending through the insulating layer 120. The nanocrystalline graphene 140 may be formed along a sidewall of the hole H10 and an upper surface of the substrate 120 or upper surface of the doped region 150 exposed by the hole H10. A metal layer 160 may fill the hole H10 and may be surrounded by the nanocrystalline graphene 140. An electrode 170 may be formed on the metal layer 160.

Figure 15E:
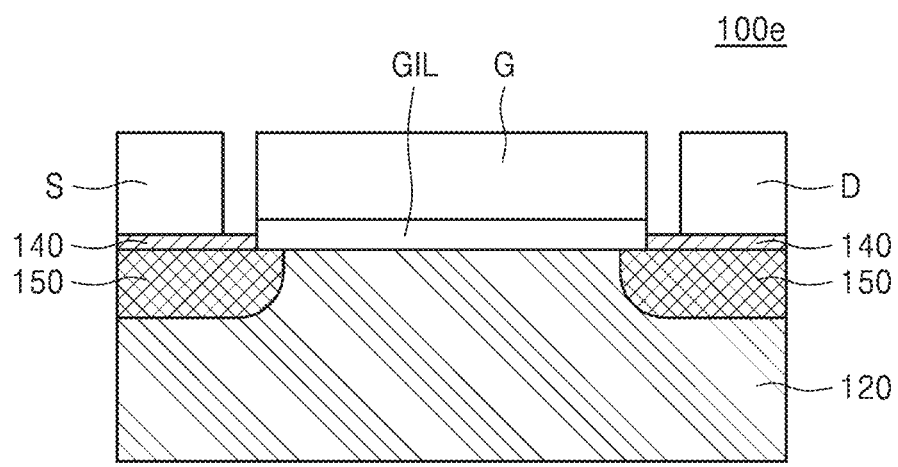

As another example, as shown in FIG. 15E, a transistor 100e according to an example embodiment may include a substrate 120 including a pair of impurity regions 150 spaced apart from each other, nanocrystalline graphene layers 140 on the impurity regions 150, a gate insulating layer GIL on a portion of the substrate 120 between the impurity regions 150, and a gate electrode G on the gate insulating layer GIL. The source electrode S, gate electrode G, and drain electrode D may be spaced apart from each other and may include conductive materials such as a metal or metal alloy. The nanocrystalline graphene layers 150 may be directly on the impurity regions 150. The gate insulating layer GIL may include an insulating material such as silicon oxide, silicon nitride, or a high-k dielectric material (e.g., hafnium oxide, aluminum oxide).

Figure 15F:

As another example, referring to FIG. 15F, a pellicle P11 may include a frame F10 and a pellicle membrane M11. The pellicle membrane M11 may include a protective layer PL10 on a first material layer NG10. The first material layer NG10 may include a nanocrystalline graphene formed according to one of the embodiments described above.

As described above, according to one or more embodiments, nanocrystalline graphene including a plurality of grains formed by stacking a plurality of graphene sheets and having a grain density of about 500 ea/μm$^2$ and a root-mean-square (RMS) roughness of about 0.1 or more and about 1.0 or less may be formed by a plasma chemical vapor deposition process. When the grain density and the roughness are within these ranges, the nanocrystalline graphene thus prepared may cover the entirety of a large area on the substrate as a thin layer. In the plasma chemical vapor deposition process, when a reaction gas includes a carbon source gas, an inert gas, and hydrogen gas, and plasma of the inert gas activates the surface of the substrate, nanocrystalline graphene may be directly grown on the surface of the substrate at a relatively low temperature of about 700° C. or lower.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A nanocrystalline graphene, comprising:
a plurality of grains in a stack of a plurality of graphene sheets,
wherein the nanocrystalline graphene has a grain density of about 500 ea/μm$^2$ or higher and a root-mean-square (RMS) roughness in a range of about 0.1 or more to about 1.0 or less,
wherein the nanocrystalline graphene is directly grown on a non-catalytic substrate by a plasma chemical vapor deposition process in a reaction chamber using plasma of a reaction gas comprising a carbon source gas and an inert gas at a temperature of about 700° C. or lower, and
wherein, when the nanocrystalline graphene is directly grown during the plasma chemical vapor deposition process, the inert gas is provided into the reaction chamber at a flow rate of in a range of about 600 sccm to about 1600 sccm.

2. The nanocrystalline graphene of claim 1,
wherein a thickness of the nanocrystalline graphene is about 10 nm or less.

3. The nanocrystalline graphene of claim 1,
wherein a thickness of the nanocrystalline graphene is about 2 nm or less.

4. The nanocrystalline graphene of claim 1,
wherein a grain size of the plurality of grains is in a range of about 0.5 nm to about 50 nm.

5. The nanocrystalline graphene of claim 1,
wherein in a Raman spectrum of the nanocrystalline graphene,
a D/G peak ratio is about 1.0 or higher, and
a 2D/G ratio is about 0.1 or higher.

6. The nanocrystalline graphene of claim 5,
wherein the nanocrystalline graphene is a graphene-on-substrate on the non-catalytic substrate.

7. The nanocrystalline graphene of claim 6,
wherein a thickness of the graphene-on-substrate is in a range of about 1 Å to about 100 Å, and about 10% or less of the graphene-on-substrate is a non-uniformity region with an area about 1×1 cm$^2$ or greater.

8. The nanocrystalline graphene of claim 6,
wherein the non-catalytic substrate is material of which bulk solubility of carbon atoms at a temperature of about 1000° C. or lower is about 0.1 or less.

9. The nanocrystalline graphene of claim 6,
wherein the non-catalytic substrate comprises at least one of a Group IV semiconductor material, a semiconductor compound, a metal, and an insulating material.

10. The nanocrystalline graphene of claim 9,
wherein the Group IV semiconductor material comprises Si, Ge, or Sn;
the semiconductor compound comprises a material in which at least two of Si, Ge, C, Zn, Cd, Al, Ga, In, B, C, N, P, S, Se, As, Sb, and Te are combined;
the metal comprises at least one of Cu, Mo, Ni, Al, W, Ru, Co, Mn, Ti, Ta, Au, Hf, Zr, Zn, Y, Cr, and Gd; and
the insulating material comprises at least one of Si, Al, Hf, Zr, Zn, Ti, Ta, W, and Mn, or
the insulating material comprises at least one of an oxide, a nitride, a carbide, or a derivative of at least one of Si, Ni, Al, W, Ru, Co, Mn, Ti, Ta, Au, Hf, Zr, Zn, Y, Cr, Cu, Mo, and Gd.

11. The nanocrystalline graphene of claim 6,
wherein the graphene-on-substrate further comprises a metal layer on the nanocrystalline graphene.

12. The nanocrystalline graphene of claim 1,
wherein the nanocrystalline graphene is directly grown on the non-catalytic substrate for a growth time of less than 90 seconds using the plasma chemical vapor deposition process.

13. The nanocrystalline graphene of claim 1, wherein
wherein, during the plasma chemical vapor deposition process, a power for generating the plasma is in a range of about 10 W to about 400 W, and the inert gas includes argon gas, and
wherein the nanocrystalline graphene is directly grown on the non-catalytic substrate for a growth time of less than 90 seconds using the plasma chemical vapor deposition process.

14. The nanocrystalline graphene of claim 13,
wherein the reaction gas does not comprise hydrogen gas.

15. The nanocrystalline graphene of claim 13,
wherein when the reaction gas further comprises hydrogen gas.

16. The nanocrystalline graphene of claim 13,
wherein the carbon source gas comprises at least one of a hydrocarbon gas and a vapor of a liquid precursor comprising carbon.

17. The nanocrystalline graphene of claim 13,
wherein the inert gas comprises at least one of argon gas, neon gas, nitrogen gas, helium gas, krypton gas, and xenon gas.

18. The nanocrystalline graphene of claim 13,
wherein the temperature of the plasma chemical vapor deposition process is in a range of about 180° C. to about 700° C. during the plasma chemical vapor deposition process.

19. The nanocrystalline graphene of claim 13,
wherein the plasma chemical vapor deposition process is performed at a processing pressure in a range of about 0.001 Torr to about 10 Torr.

20. The nanocrystalline graphene of claim 13,
wherein the plasma of the reaction gas is generated using a radio frequency (RF) plasma generating device operating at a frequency range of about 3 MHz to about 100 MHz.

21. A method of forming a nanocrystalline graphene, the method comprising:
    injecting a reaction gas comprising a carbon source gas and an inert gas into a reaction chamber;
    generating a plasma of the reaction gas in the reaction chamber; and
    growing the nanocrystalline graphene directly on a non-catalytic substrate by a plasma chemical vapor deposition process using the plasma of the reaction gas at a temperature of about 700° C. or lower, wherein
    when the nanocrystalline graphene is directly grown during the plasma chemical vapor deposition process, the inert gas is provided into the reaction chamber at a flow rate of in a range of about 600 sccm to about 1600 sccm,
    the nanocrystalline graphene includes a plurality of grains in a stack of a plurality of graphene sheets,
    the nanocrystalline graphene has a grain density of about 500 ea/$\mu m^2$ or higher and a root-mean-square (RMS) roughness in a range of about 0.1 or more to about 1.0 or less.

22. The method of claim 21,
wherein the generating the plasma of the reaction gas in the reaction chamber is performed using at least one radio frequency (RF) plasma generating device or at least one microwave (MW) plasma generating device.

23. The method of claim 21,
wherein the plasma comprises RF plasma having a frequency range of about 3 MHz to about 100 MHz and MW plasma having a frequency range of about 0.7 GHz to about 2.5 GHz.

24. The method of claim 21 further comprising:
    pretreating a surface of the non-catalytic substrate using a reducing gas before the growing the nanocrystalline graphene.

25. The method of claim 21, wherein the growing the nanocrystalline graphene directly on the non-catalytic substrate includes:
    forming a first nanocrystalline graphene on the non-catalytic substrate; and
    forming a second nanocrystalline graphene on the first nanocrystalline graphene by controlling a mixing ratio of the reaction gas.

* * * * *